United States Patent
Lichtenwalner et al.

(10) Patent No.: US 11,894,455 B2
(45) Date of Patent: Feb. 6, 2024

(54) VERTICAL POWER DEVICES FABRICATED USING IMPLANTED METHODS

(71) Applicant: Wolfspeed, Inc., Durham, NC (US)

(72) Inventors: Daniel Jenner Lichtenwalner, Raleigh, NC (US); Sei-Hyung Ryu, Cary, NC (US); Arman Ur Rashid, Durham, NC (US)

(73) Assignee: Wolfspeed, Inc., Durham, NC (US)

(*) Notice: Subject to any disclaimer, the term of this patent is extended or adjusted under 35 U.S.C. 154(b) by 143 days.

(21) Appl. No.: 17/482,019

(22) Filed: Sep. 22, 2021

(65) Prior Publication Data

US 2023/0087937 A1   Mar. 23, 2023

(51) Int. Cl.
| | | |
|---|---|---|
| H01L 29/78 | (2006.01) | |
| H01L 29/808 | (2006.01) | |
| H01L 29/861 | (2006.01) | |
| H01L 29/66 | (2006.01) | |

(52) U.S. Cl.
CPC .... H01L 29/7802 (2013.01); H01L 29/66712 (2013.01); H01L 29/8083 (2013.01); H01L 29/861 (2013.01)

(58) Field of Classification Search
CPC ........... H01L 29/7802; H01L 29/66712; H01L 29/8083; H01L 29/861; H01L 29/0619; H01L 21/046; H01L 29/66045; H01L 29/872; H01L 29/1066; H01L 29/1608
See application file for complete search history.

(56) References Cited

U.S. PATENT DOCUMENTS

| | | | |
|---|---|---|---|
| 9,887,287 B1 * | 2/2018 | Lichtenwalner | H01L 29/66348 |
| 10,763,356 B1 * | 9/2020 | Sundaresan | H01L 29/7813 |
| 2018/0166530 A1 * | 6/2018 | Lichtenwalner | H01L 29/063 |
| 2021/0343834 A1 * | 11/2021 | Lichtenwalner | H01L 29/1608 |
| 2022/0149196 A1 * | 5/2022 | Kim | H01L 29/8083 |

OTHER PUBLICATIONS

Chatty, Kiran, et al., "900V, 1.46mOhm-cm2 4H—SiC Depletion Mode Vertical JFET," Materials Science Forum, vols. 740-742, 2013, pp. 915-920.

* cited by examiner

Primary Examiner — Shahed Ahmed
Assistant Examiner — Khatib A Rahman
(74) Attorney, Agent, or Firm — Sage Patent Group

(57) ABSTRACT

A precursor for a vertical semiconductor device is provided with a substrate, a drift region over the substrate, and an upper precursor region over the drift region. The top surface of the precursor is substantially planar, and the substrate and the drift region are doped with a first dopant of a first polarity. In a first embodiment, a series of implants with a second dopant is provided in the upper precursor region via the top surface to form each of at least two gate regions such that each implant of the series of implants is provided at a different depth below the top surface. In a second embodiment, a series of implants with the first dopant is provided in the upper precursor region via the top surface to form a channel region that has at least a portion between two gate regions.

31 Claims, 37 Drawing Sheets

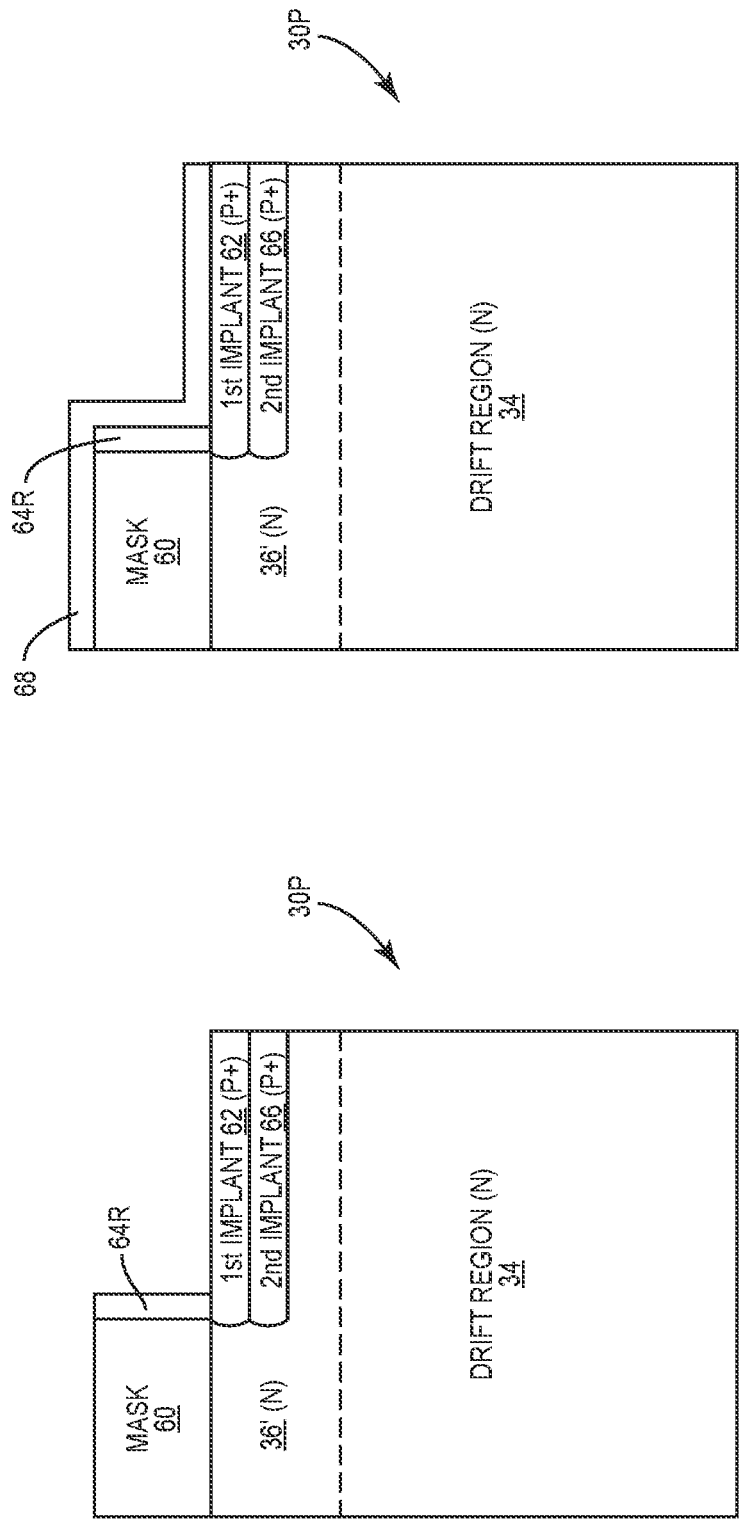

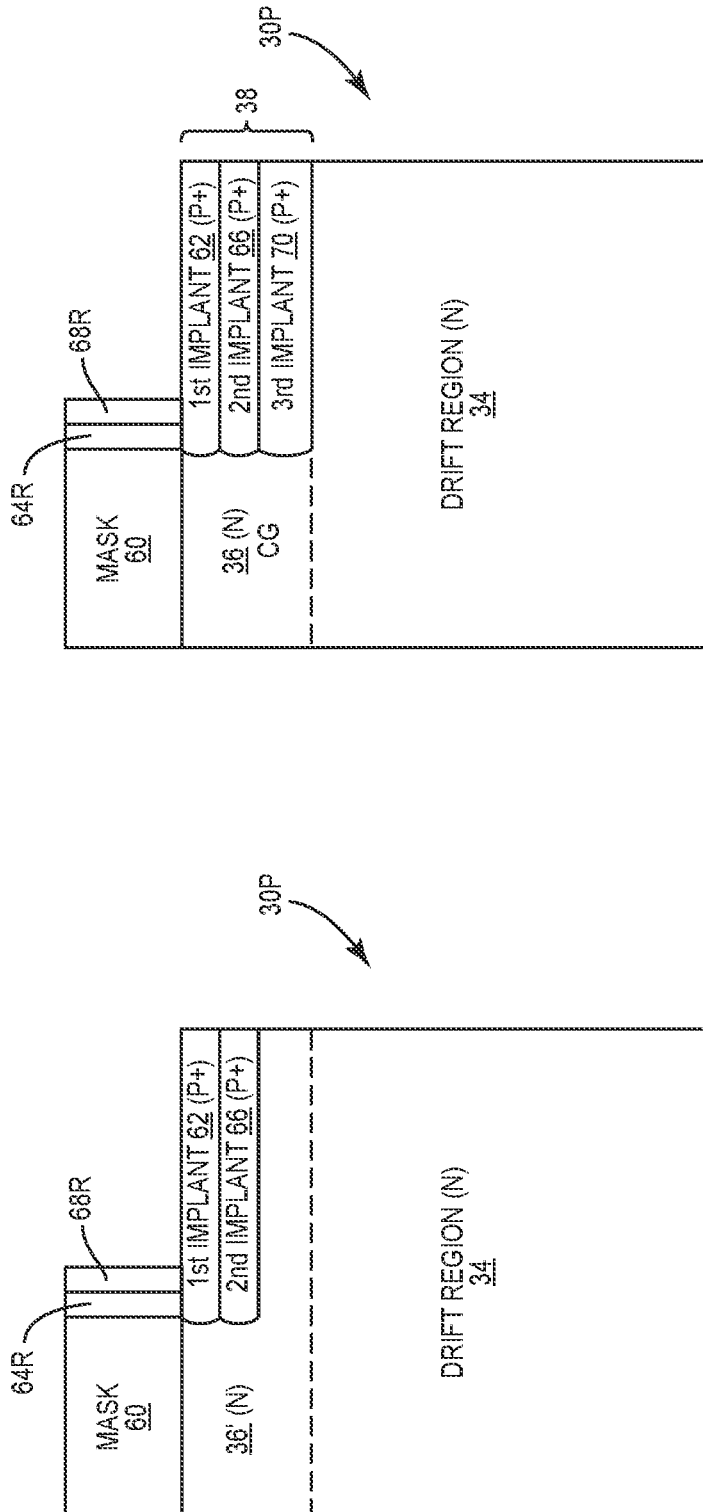

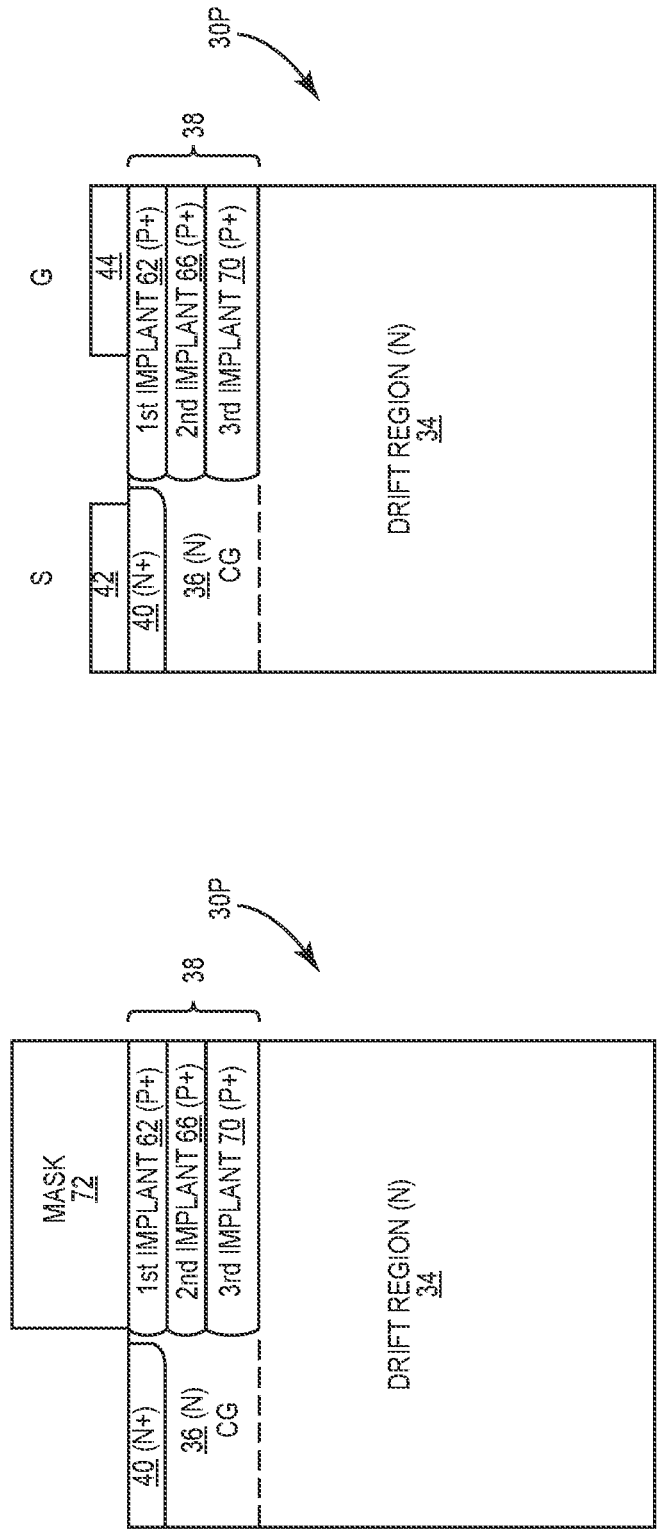

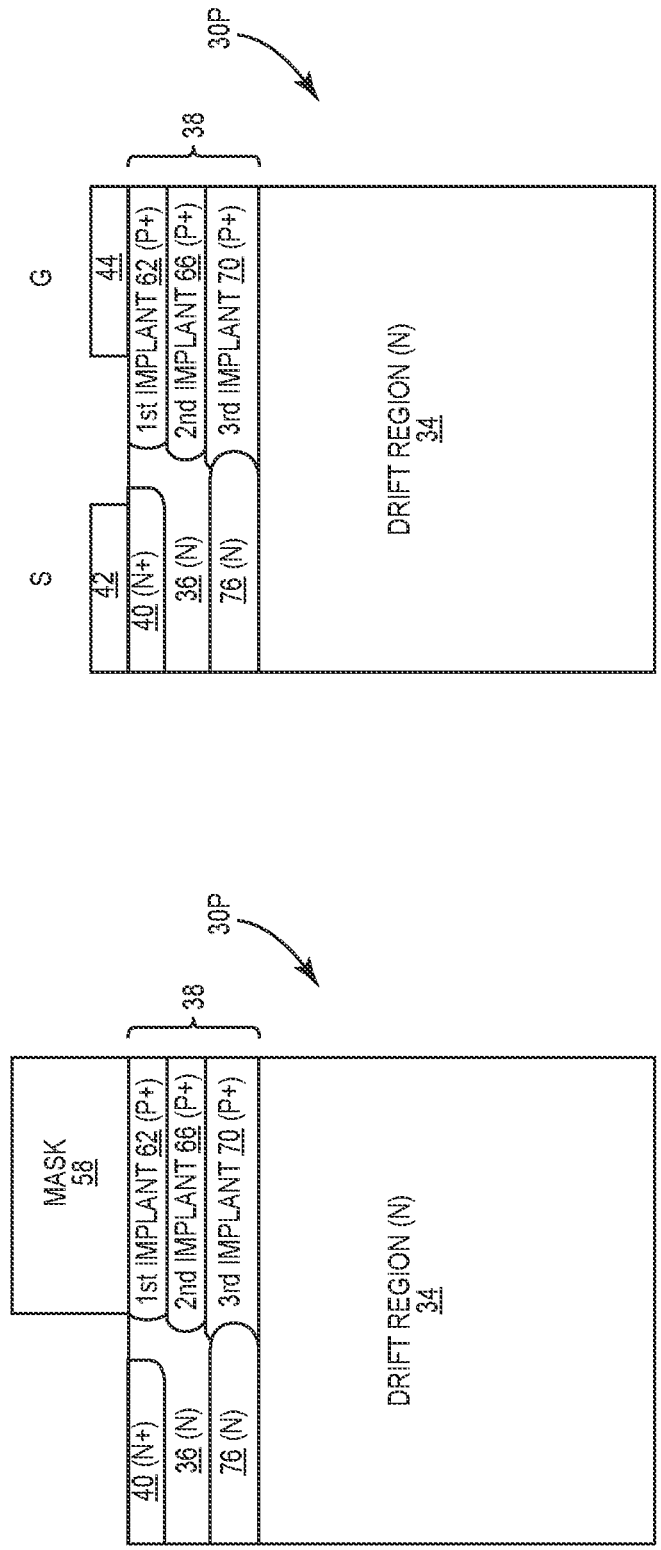

VERTICAL POWER DEVICES FABRICATED USING IMPLANTED METHODS

FIELD OF THE DISCLOSURE

The present disclosure relates to vertical field effect devices with improved performance and efficient fabrication techniques for making the same.

BACKGROUND

Vertical semiconductor devices come in several varieties, each of which may be used for different applications. One notable use of vertical semiconductor devices is for high power applications. In particular, devices such as PiN diodes, Schottky diodes, metal-oxide semiconductor field-effect transistors (MOSFETs), junction field-effect transistors (JFETs), and the like may be rated for high blocking voltages and on-state currents, and thus are often used for these power applications. Given the ever-increasing pressure to provide higher performing devices at lower costs, there is continuing need for novel device structures and fabrication techniques that result in higher performance, lower cost, or both.

SUMMARY

The present disclosure relates to vertical semiconductor devices, such as transistors, diodes, and the like as well as fabrication techniques for building the same. A precursor is provided with a substrate, a drift region over the substrate, and an upper precursor region over the drift region. The top surface of the precursor is substantially planar, and the substrate and the drift region are doped with a first dopant of a first polarity. In a first embodiment, a series of implants with a second dopant is provided in the upper precursor region via the top surface to form each of at least two gate regions such that each implant of the series of implants is provided at a different depth below the top surface. The second dopant will have a second polarity opposite that of the first polarity. At least a portion of a channel region is provided between the at least two gate regions, and a conducting gap is defined within the channel region and between opposing sidewalls of the at least two gate regions.

In a second embodiment, a series of implants with the first dopant is provided in the upper precursor region via the top surface to form a channel region that has at least a portion between two gate regions. Each implant of the series of implants is provided at a different depth below the top surface, wherein the second dopant has a second polarity opposite that of the first polarity. Each of the two gate regions is doped with a second dopant that has a polarity opposite that of the first dopant. A conducting gap is defined within the channel region and between opposing sidewalls of the at least two gate regions.

For the embodiments where the series of implants are used to form the gate regions, the following options are available. In one embodiment, prior to providing the series of implants, the process includes providing a mask on the top surface over an area below which a central portion of the channel region will be formed, wherein areas on the top surface over which the at least two gate regions will be formed are exposed for the series of implants. Each successive one of the series of implants may be below a preceding one of the series of implants, and may have an inner sidewall that straggles further inward toward the channel region than a preceding one of the series of implants.

In certain embodiments, a single mask is the only mask used for the series of implants. In other embodiments, multiple masks are used.

In one embodiment, the process includes providing an implant in the channel region to form a deep implant. As such, the deep implant is horizontally aligned with and overlaps opposing sidewalls of the at least one of the series of implants to effectively move the opposing sidewalls of the at least one of the series of implants laterally outward from the channel region.

In certain embodiments, the deep implant is horizontally aligned with a second or greater of the series of implants; the deep implant is not horizontally aligned with a first of the series of implants; and/or the deep implant is not horizontally aligned with a first of the series of implants. Each successive one of the series of implants may be below and may have an inner sidewall that is substantially aligned with a preceding one of the series of implants.

In one embodiment, prior to the first implant of the series of implants, the process includes providing a mask on the top surface over an area below which a central portion of the channel region will be formed, wherein areas on the top surface over which the at least two gate regions will be formed are exposed for the series of implants. Prior to each successive implant of the series of implants, the process in this embodiment may include providing a lateral extension of the mask on a side opposite that of the channel region by a desired thickness sufficient to keep the inner sidewall of each successive implant substantially aligned with the inner sidewall of the preceding one of the series of implants. The process for this embodiment when providing each lateral extension of the mask may include depositing an etchable layer over the mask and exposed portions of the top surface, as well as etching an etchable layer such that a residual portion of the etchable layer remains on a sidewall of the mask to provide the lateral extension.

In one embodiment, the process may include, prior to the first implant of the series of implants, providing a mask on the top surface over an area below which a central portion of the channel region will be formed, wherein the sidewalls of the mask are angled such that a bottom surface and each of the sidewalls of the mask form an acute angle. The acute angle may reside in a range of 30 degrees to 88 degrees, 35 to 85 degrees, and 40 to 75 degrees. Each successive one of the series of implants may be below a preceding one of the series of implants and may wrap around a sidewall of a preceding one of the series of implants. Each successive one of the series of implants may also wrap around a sidewall of a preceding one of the series of implants up to the top surface of the precursor.

In most embodiments, the process may further include providing an implant of the first dopant along a bottom of the upper precursor region to form a spreading layer. Most embodiments may also include providing an implant of the second dopant in each of the at least two gate regions adjacent the top surface to form at least two gate ohmic regions. The at least two gate ohmic regions are doped at a concentration higher than the at least two gate regions. A gate contact may also be formed over each of the at least two gate ohmic regions.

A source contact may be formed on the top surface over the channel region. The process may include providing an implant of the second dopant beneath the top surface in the channel region to form a source ohmic region, wherein the source contact is formed on the top surface over the source ohmic region. A drain contact may be provided on a bottom surface of the substrate opposite the drift region.

In certain embodiments, there are at least three implants in the series of implants. Other embodiments may only need two implants. Each successive one of the series of implants may be below or above preceding ones of the series of implants in different embodiments.

In certain embodiments, the at least two gate regions have a doping concentration in the range of 5E16 to 1e19 $cm^{-3}$; 1E17 to 1E20 $cm^{-3}$; or 5E16 to 1E20 $cm^{-3}$ of the second dopant, and the channel region has a doping concentration in the range of 1E14 to 1E17 $cm^{-3}$; 5E15 to 1E18 $cm^{-3}$; 1E14 to 1E18 $cm^{-3}$ of the first dopant.

For the embodiments where the series of implants are used to form the channel region, the following options are available. In one embodiment, each successive one of the series of implants is below and has an outer sidewall that straggles further outward toward an adjacent one of the gate regions than a preceding one of the series of implants. Prior to providing the series of implants, a mask may be provided on the top surface wherein an area on the top surface over which the channel region will be formed is exposed for the series of implants. The mask may be the only mask used for the series of implants in certain embodiments, wherein other embodiments may use multiple masks.

In one embodiment, an implant is provided in each gate region to form a deep implant. Each deep implant is horizontally aligned with and overlaps a sidewall of the at least one of the series of implants to effectively move the sidewall of the at least one of the series of implants laterally inward toward a central portion of the channel region. The deep implant may be horizontally aligned with a second or greater of the series of implants and/or not horizontally aligned with a first of the series of implants.

In one embodiment, prior to providing the series of implants, a mask is provided on the top surface, wherein an area on the top surface over which the channel region will be formed is exposed for the series of implants. Prior to each successive implant after the first implant, a portion of the opposing sidewalls of the mask is etched away by an amount sufficient to keep the inner sidewall of each successive implant substantially aligned with the inner sidewall of the preceding one of the series of implants. For this embodiment, each successive one of the series of implants may be above a preceding one of the series of implants. Further, a doping concentration for each successive one of the series of implants may be less than, greater than, or equal to that of a preceding one of the series of implants.

In other embodiments, each successive one of the series of implants is below or above a preceding one of the series of implants.

In most embodiments, the process may further include providing an implant of the first material along a bottom of the upper precursor region to form a spreading layer. Most embodiments may also include providing an implant of the second dopant in each of the at least two gate regions adjacent the top surface to form at least two gate ohmic regions. The at least two gate ohmic regions are doped at a concentration higher than the at least two gate regions. A gate contact may also be formed over each of the at least two gate ohmic regions.

A source contact may be formed on the top surface over the channel region. The process may include providing an implant of the second dopant beneath the top surface in the channel region to form a source ohmic region, wherein the source contact is formed on the top surface over the source ohmic region. A drain contact may be provided on a bottom surface of the substrate opposite the drift region.

In certain embodiments, there are at least three implants in the series of implants. Other embodiments may only need two implants. Each successive one of the series of implants may be below or above preceding one of the series of implants in different embodiments.

In certain embodiments, the at least two gate regions have a doping concentration in the range of 5E16 to 1e19 $cm^{-3}$; 1E17 to 1E20 $cm^{-3}$; or 5E16 to 1E20 $cm^{-3}$ of the second dopant, and the channel region has a doping concentration in the range of 1E14 to 1E17 $cm^{-3}$; 5E15 to 1E18 $cm^{-3}$; 1E14 to 1E18 $cm^{-3}$ of the first dopant.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
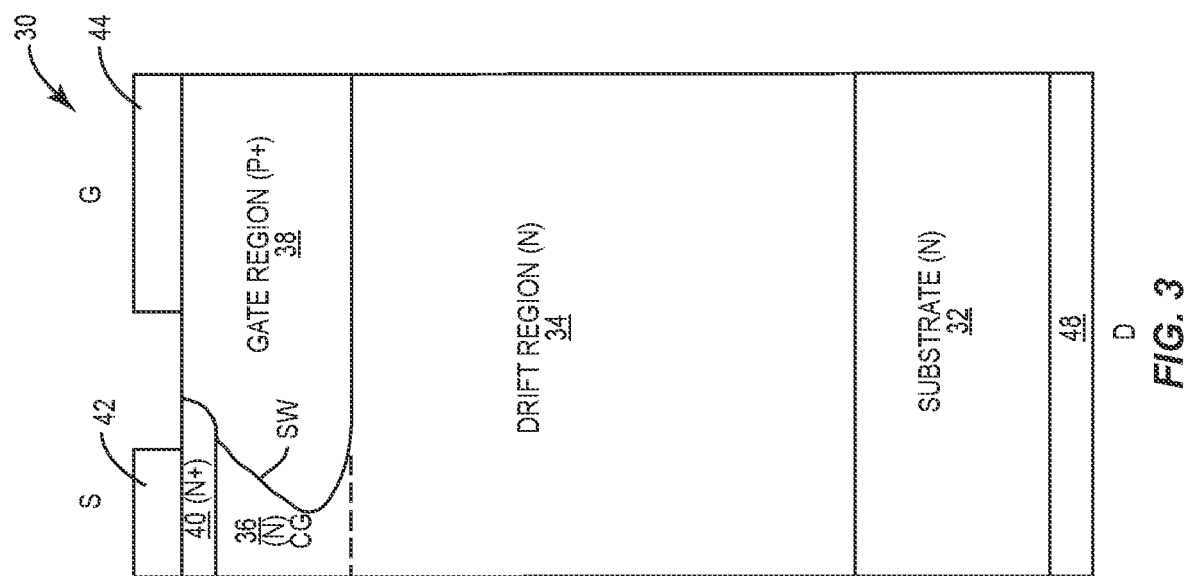
FIG. 3 is a schematic half-cell of a JFET according to an exemplary embodiment of the present disclosure.

FIGS. 4A-4G graphically illustrate select steps of a fabrication process for fabricating the JFET of FIG. 3.

Figure 5:
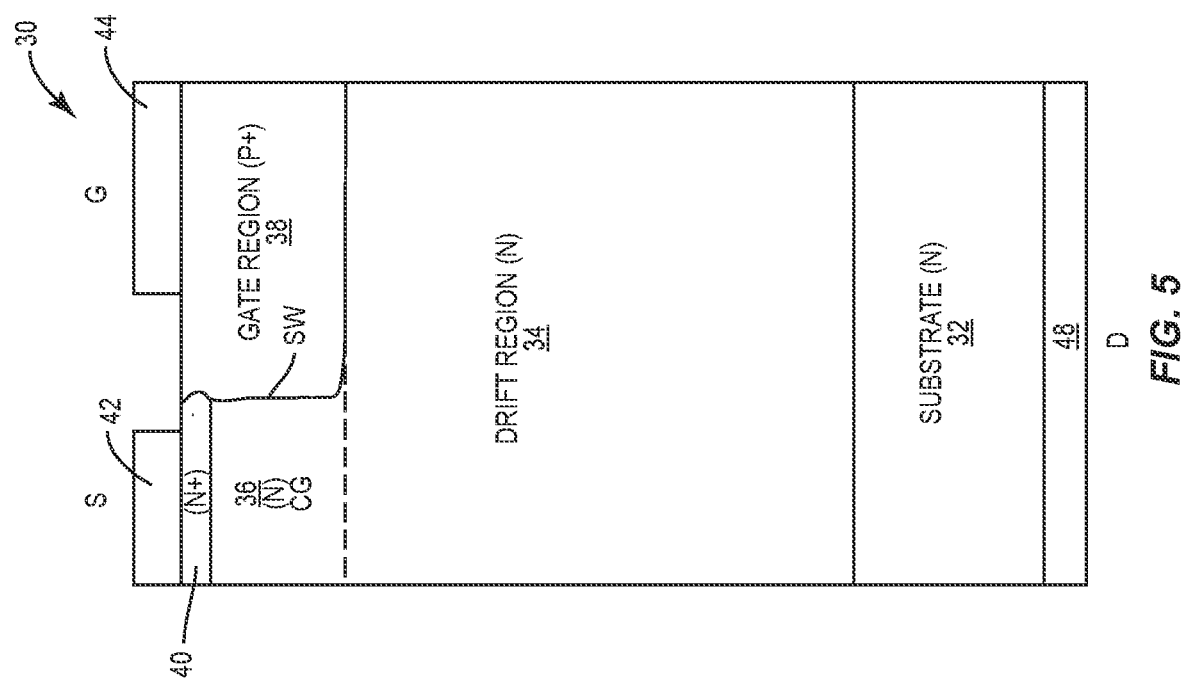

FIG. 5 is a schematic half-cell of a JFET according to an exemplary embodiment of the present disclosure.

FIGS. 6A-6L graphically illustrate select steps of a fabrication process for fabricating the JFET of FIG. 5.

Figure 7:
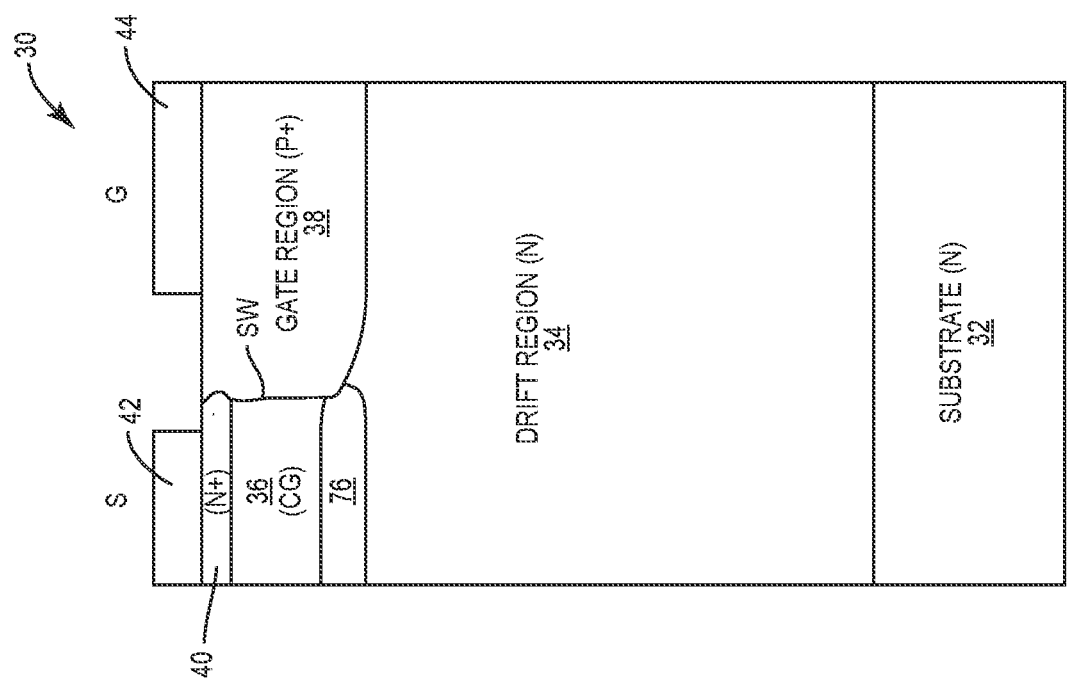

FIG. 7 is a schematic half-cell of a JFET according to an exemplary embodiment of the present disclosure.

FIGS. 8A-8H graphically illustrate select steps of a fabrication process for fabricating the JFET of FIG. 7.

Figure 9:
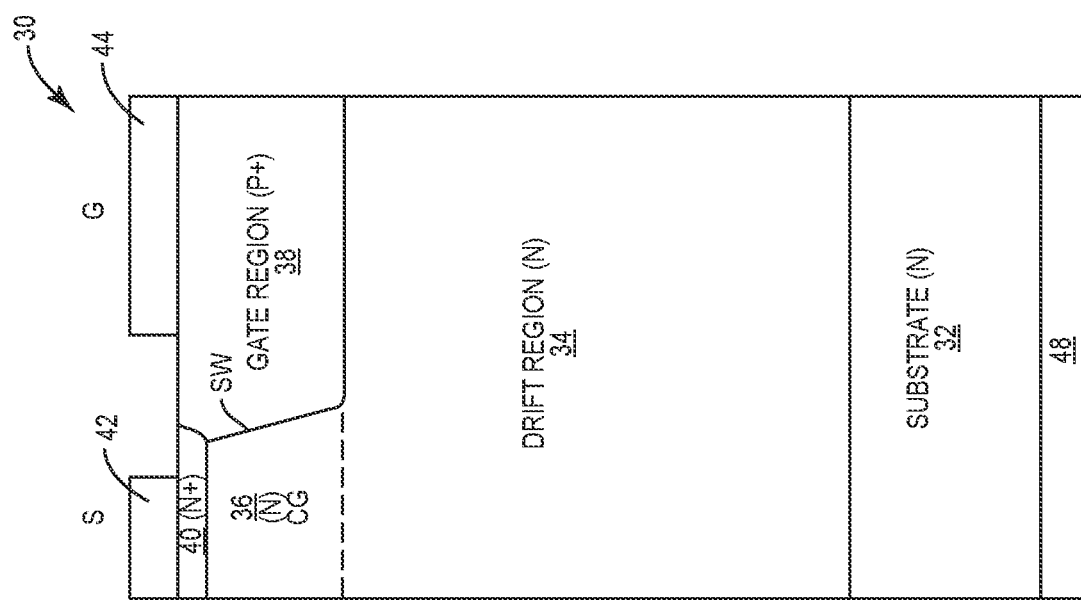

FIG. 9 is a schematic half-cell of a JFET according to an exemplary embodiment of the present disclosure.

FIGS. 10A-10G graphically illustrate select steps of a fabrication process for fabricating the JFET of FIG. 9.

FIGS. 11A-11I graphically illustrate select steps of a fabrication process for fabricating a JFET according to an exemplary embodiment of the disclosure.

FIGS. 12A-12D graphically illustrate select steps of a fabrication process for fabricating a JFET according to an exemplary embodiment of the disclosure.

FIGS. 13A-13G graphically illustrate select steps of a fabrication process for fabricating a JFET according to an exemplary embodiment of the disclosure.

Figure 14:
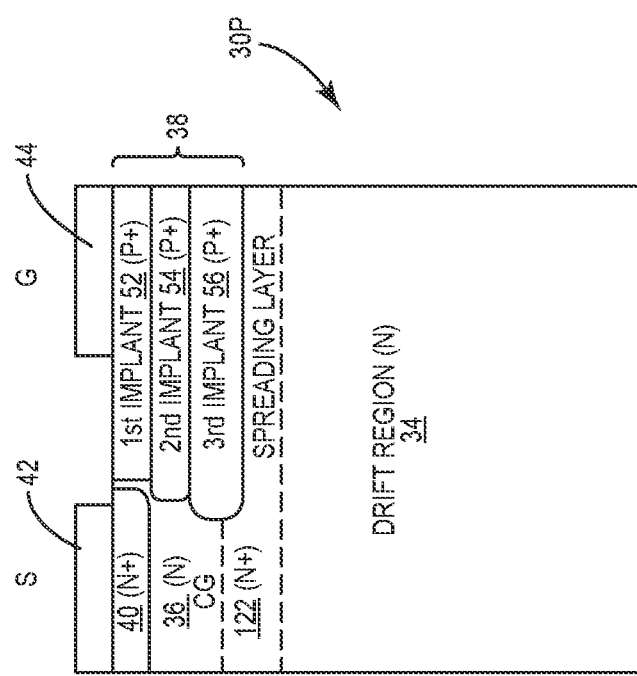

FIG. 14 is a cross-section of a JFET according to one embodiment of the present disclosure.

Figure 15:
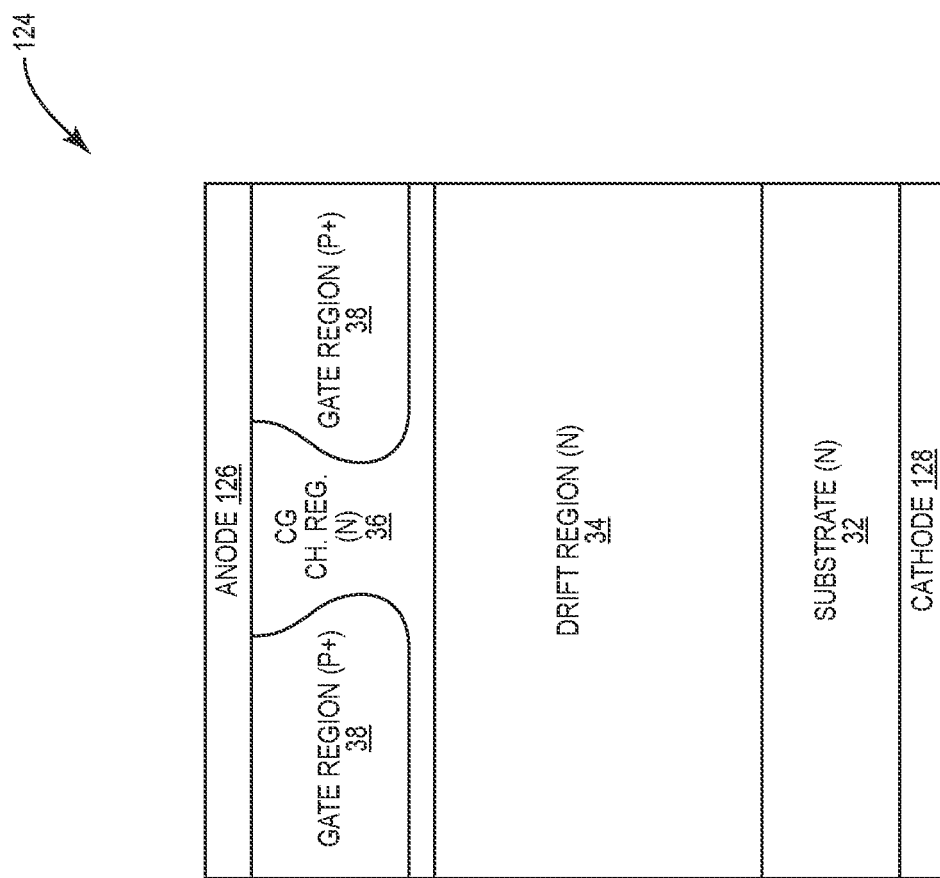

FIG. 15 is a cross-section of a diode according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. Doping concentrations are referenced using the nomenclature: aEb cm$^{-3}$, which represents a×10$^{b}$ cm$^{-3}$ and where cm is centimeters. For example, 5E16 cm$^{-3}$ equals 5×10$^{16}$ cm$^{-3}$, where a is 5 and b is 16.

The present disclosure relates to vertical semiconductor devices, such as transistors, diodes, and the like as well as fabrication techniques for building the same. Generally, a precursor is provided with a substrate, a drift region over the substrate, and an upper precursor region over the drift region. The top surface of the precursor is substantially planar, and the substrate and the drift region are doped with a first dopant of a first polarity. In a first embodiment, a series of implants with a second dopant is provided in the upper precursor region via the top surface to form each of at least two gate regions such that each implant of the series of implants is provided at a different depth below the top surface. The second dopant will have a second polarity opposite that of the first polarity. At least a portion of a channel region is provided between the at least two gate regions, and a conducting gap is defined within the channel region and between opposing sidewalls of the at least two gate regions.

In a second embodiment, a series of implants with the first dopant is provided in the upper precursor region via the top surface to form a channel region that has at least a portion between two gate regions. Each implant of the series of implants is provided at a different depth below the top surface, wherein the second dopant has a second polarity opposite that of the first polarity. Each of the two gate regions is doped with a second dopant that has a polarity opposite that of the first dopant. A conducting gap is defined within the channel region and between opposing sidewalls of the at least two gate regions.

Details for these fabrication techniques and device structures are provided below. Specific examples of junction field-effect transistors (JFETs) are illustrated; however, the concepts provided apply to other implanted regions of other types of transistors, such as MOSFETs and IGBTs as well as to junction barrier Schottky (JBS), merged PiN Schottky (MPS), and like diodes by modifying the contact structure and placement, as those skilled in the art will appreciate. The associated figures for the text below relate to a striped device structure of conducting channels that extend into the plane of the drawings, but the layouts are not limited to such structure. The surface layout could be stripes, rectangles, circles, polygons, and the like.

Figure 1:
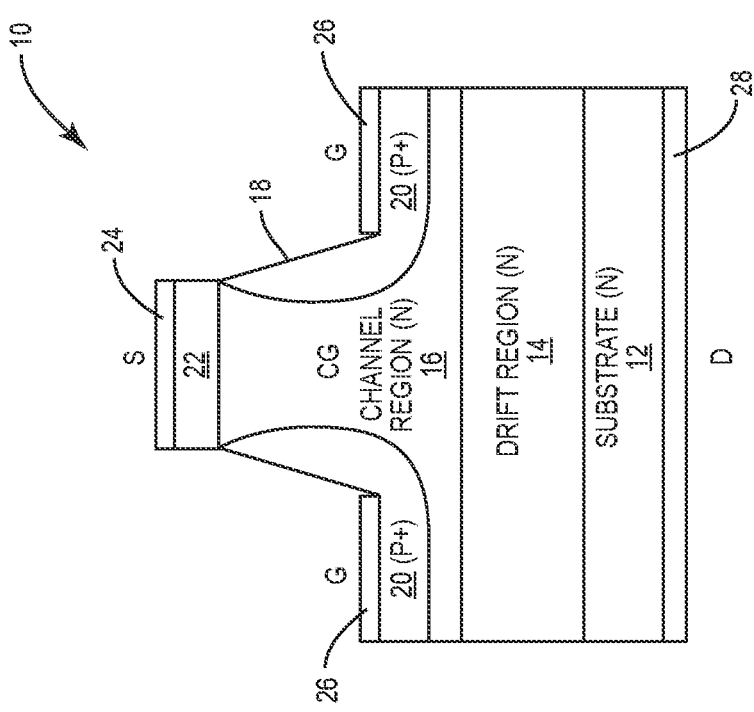
FIG. 1 is a cross-sectional block diagram of a junction field-effect transistor (JFET) according to the related art.

FIG. 1 illustrates a cross-sectional view of a junction field-effect transistor (JFET) 10 of the related art. The JFET 10 is a vertical JFET in that current flows vertically through the device between the source (S) and the drain (D) based on the voltage applied at the gate (G). In the illustrated embodiment, the JFET 10 includes a substrate 12, a drift region 14 over the substrate 12, and a channel region 16 over the drift region 14. The upper portion of the body of the JFET 10 is etched to form a mesa 18. Gate regions 20 are formed in opposing sides of the mesa 18 and extend downward and outward along the upper portion of the body of the JFET 10. As such, the channel region 16 resides between the gate regions 20 in the mesa 18 as well as between the bottom of the respective gate regions 20 and the top of the drift region 14.

An ohmic region 22 is formed in the top of the mesa 18, wherein a source contact 24 is provided on the top of the ohmic region 22. Gate contacts 26 are formed on the recessed portions that reside on either side of the mesa 18. The gate contacts 26 reside over the horizontal sections of the respective gate regions 20. A drain contact 28 resides along the bottom of the substrate 12.

As illustrated, the body of the JFET 10 is silicon carbide (SiC); however, other semiconductor material systems, such as silicon (Si), Germanium (Ge), Silion Germanium (SiGe), Gallium Nitride (GaN), Aluminum Nitride (AlN), Gallium Oxide (Ga$_2$O$_3$), and diamond are applicable. The substrate 12, drift region 14, channel region 16, and gate regions 20 may be SiC, wherein each section is formed by implanting N-type or P-type dopants at varying locations and concentrations within the body of the JFET 10. In the illustrated example, the substrate 12 is moderately doped with an N-type dopant, the drift region 14 is moderately doped with an N-type dopant, the channel region 16 is moderately doped with an N-type dopant, the gate regions 20 are heavily doped with a P-type dopant, and the ohmic region 22 is heavily doped with an N-type dopant. As those skilled in the art will appreciate, the actual and relative doping levels for each region of the JFET 10 will depend on the desired characteristics of the JFET 10 and may vary from one application to another. The polarity of the doping for each region may be reversed from what is illustrated in the embodiments that follow. The source, gate, and drain contacts 24, 26, 28 may be formed from an appropriate metal or other highly conductive material.

The vertical portion of the mesa 18 that resides between the gate regions 20 provides the JFET conducting gap CG. The illustrated section is a cross-section of a full repeating cell in a larger device that comprises many cells, which are striped in the Z-direction (into the figure). The mesa 18 is formed by an etching process, and the gate regions 20 are formed using angled implants at different orientations. In the illustrated example, the implants are provided at four different angles. As such, fabrication of this embodiment is a complex process, and the more complex the process, the more expensive it is to fabricate the device. To further complicate matters, the amount of the P-type dopant along the sides of the mesa 18 necessary to form the gate regions 20 is a function of the angle of the sidewalls of the mesa 18. As such, etch control for the formation of the mesa 18 is critical.

Figure 2:
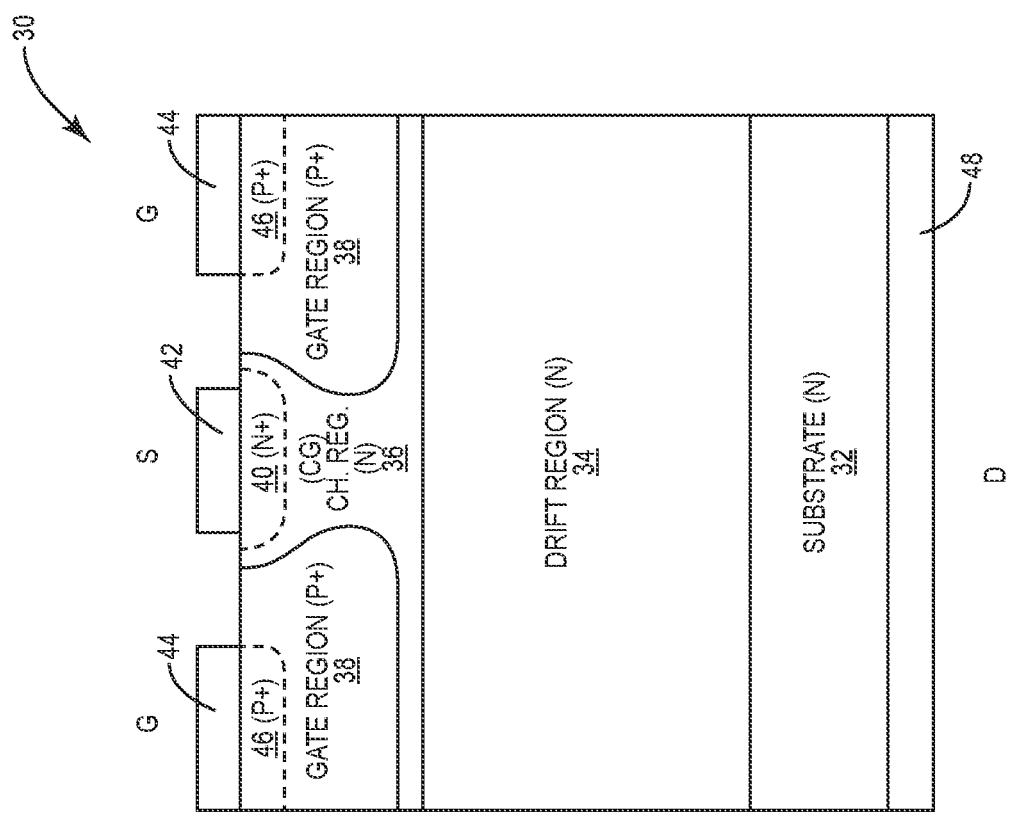
FIG. 2 is a cross-section of a JFET according to one embodiment of the present disclosure.

FIG. 2 illustrates a cross-section of a vertical JFET 30 according one embodiment of the present disclosure. The JFET 30 includes a substrate 32, a drift region 34 over the substrate 32, and a channel region 36 over the drift region 34. The channel region 36 has a portion that extends vertically upward from the drift region 34 between two opposing gate regions 38. The portion of the channel region 36 that resides between the gate regions 38 provides the conducting gap CG.

A source ohmic region 40 is provided just above the conducting gap CG of the channel region 36 and between the gate regions 38. A source contact 42 is provided over the source ohmic region 40. Gate contacts 44 are provided over the respective gate regions 38. In certain embodiments, gate ohmic regions 46 may be just below the gate contacts 44. The source and gate ohmic regions 40, 46 are highly doped regions used to provide highly conductive connections between the source and gate contacts 42, 44 and the respective underlying channel region 36 and gate regions 38. A drain contact 48 is provided along the bottom of the substrate 32.

In one embodiment, the body of the JFET 30 is silicon carbide (SiC); however, other material systems, such as those identified above are applicable. As such, the substrate 32, drift region 34, channel region 36, gate regions 38, source ohmic region 40, and gate ohmic regions 46 may be SiC, wherein each section is formed by implanting N-type or P-type dopants at varying locations and concentrations within the body of the JFET 30. In select embodiments, the substrate 32 is heavily doped with an N-type dopant at exemplary concentrations in the range of 1E18 to 1E19 cm$^{-3}$; 1E19 to E20 cm$^{-3}$; or 1E18 to 1E19 cm$^{-3}$, and the drift region 34 is moderately doped with an N-type dopant at exemplary concentrations in the range of 1E15 to E16 cm$^{-3}$; 1E16 to 2E17 cm$^{-3}$; or 1E15 to 2E17 cm$^{-3}$, the channel region 36 is moderately doped with an N-type dopant at exemplary concentrations in the range of 1E15 to E16 cm$^{-3}$; 1E16 to 2E17 cm$^{-3}$; or 1E15 to 2E17 cm$^{-3}$, the gate regions 38 are heavily doped with a P-type dopant at exemplary concentrations in the range of 5E16 to 1E18 cm$^{-3}$; 1E18 to 1E20 cm$^{-3}$, or 5E16 to 1E20 cm$^{-3}$, the source ohmic region 40 is heavily doped with an N-type dopant at exemplary concentrations in the range of 1E18 to 1E19 cm$^{-3}$; 1E19 to 1E21 cm$^{-3}$; or 1E18 to 1E21, and the gate ohmic regions 46 are heavily doped with an P-type dopant at exemplary concentrations in the range of 1E18 to 1E19 cm$^{-3}$; 1E19 to 1E21 cm$^{-3}$; or 1E18 to 1E21 cm$^{-3}$. These are merely exemplary doping levels, wherein embodiments that incorporate the inventive concepts described herein and within the scope of the claims that follow may fall anywhere within or outside of the ranges listed above.

As those skilled in the art will appreciate, the actual and relative doping levels for each region of the JFET 30 will depend on the desired characteristics of the JFET 30 and may vary from one application to another. The polarity of the doping for each region may be reversed from what is illustrated. The source, gate, and drain contacts 42, 44, 48 may be formed from an appropriate metal or other highly conductive material, such as Nickel (Ni), Titanium (Ti), and similar metals or conducting layers that will form ohmic contacts with the semiconductor contacts.

A notable characteristic of the embodiment of FIG. 2 is the relatively planar top surface provide by the JFET 30, as opposed to the pillared nature provided by the mesa 18 of the JFET 10 of FIG. 1. The following description provides several techniques for fabricating the JFET 30. These techniques rely primarily on implantation processes for fabricating the JFET 30 of FIG. 2, as opposed to etching processes as required to fabricate the JFET 10 of FIG. 1.

A first process is shown in association with the JEFT 30 of FIG. 3, which illustrates a schematic half-cell of the JFET 30. The illustrated half-cells for this and subsequent embodiments will generally have mirrored symmetry along the left and/or right edges of the figures. Notably, the gate region 38 for this embodiment continues to straggle or bleed inward toward the center of the channel region 36 with depth such that the opening provided for the conducting CG narrows near the bottom of the channel region 36. In other words, the gate regions 38 effectively have angled sidewalls SW, wherein the bottoms of the opposing sidewalls SW for the respective gate regions 38 are laterally closer to each other than the tops of the sidewalls SW, such that the conducting gap CG (i.e. the area of the channel region 36 that resides between the gate regions 38) is generally V-shaped.

Figure 4B:
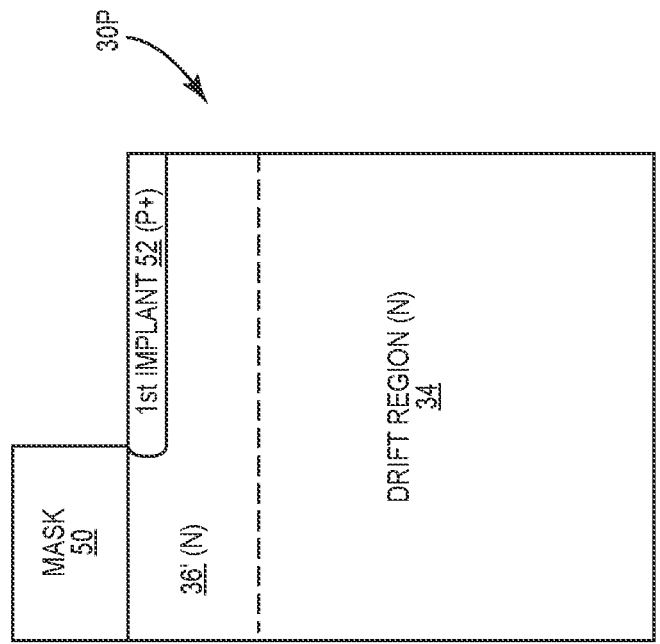
Figure 4A:
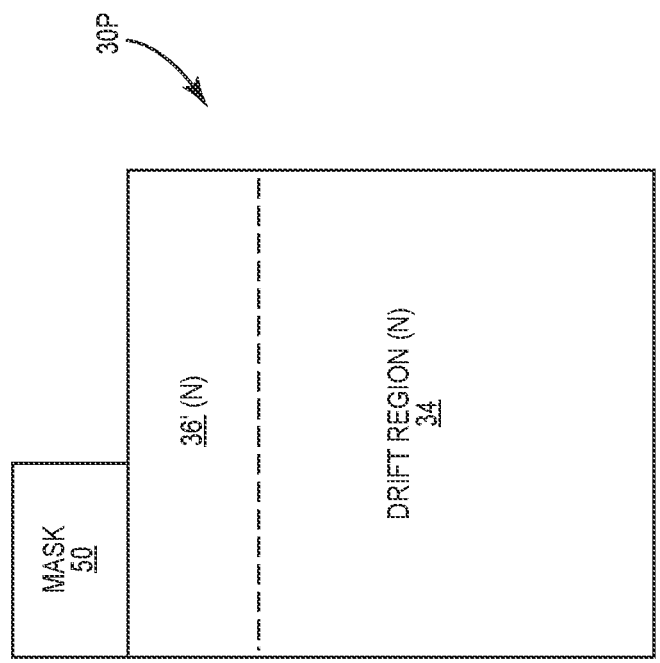

As shown in FIG. 4A, the process starts by applying a mask 50 over a portion of a top, substantially planar surface of a precursor 30P of the JFET 30. The location of the mask 50 corresponds to an area on the surface of the precursor 30P that resides over the central portion of what will become the channel region 36. The portion of the precursor 30P that resides over the drift region 34 and/or beneath the top surface of the precursor 30P and in which the channel region 36 and the gate regions 38 will be formed is generally referred to as an upper precursor region 36'. The upper precursor region 36' may be a unitary part of the overall body of the precursor 30P or a separate epitaxially grown layer over the drift region 34. When separately grown, the upper precursor region 36' may be doped during the growth process or through implantation. Examples of each are provided below; however, each type of the upper precursor region 36' is applicable to each embodiment.

To form the gate regions 38 in the top of the precursor 30P, a series of implants, which successively increase in energy, are provided into the upper precursor region 36'. For each of the gate regions 38, each of the successive implants will form at a different depth due to the increased energy levels. As illustrated, there are three successive implants which range from approximately 50 kilo-electronvolts (50 keV) to 2 mega-electronvolts (2 meV), but any number of implants are envisioned over varying energy levels. Each successive implant is deeper than a preceding implant; however, the process may be reversed such that each successive implant is above a preceding implant.

For this embodiment as well as the other embodiments described below that use successive implants to form the gate regions 38, the implants may be "channeled" implants. Channeled implants are implants where the implant angle is parallel to open atomic channels in the crystal (to within about ±0.3 degrees). SiC channeled implants are generally parallel to the (0001) axis, or 4 degrees of tilt from a typical SiC crystal that is cut 4 degrees from the (0001) plane. Different materials and crystals may need a slightly different implant angle to achieve channeling of the implants through the crystal. For successive implants, the doping may be provided at different energy levels for each implant, wherein the deeper the implant, the higher the energy level. The channeled implant typically gives a deeper implant, with a more uniform implant concentration with depth, and is thus desirable for many applications.

Accordingly, a P-type dopant is implanted into the unmasked portions of the upper precursor region 36' at a first concentration and at a first energy level to form first implants 52, as illustrated in FIG. 4B. The first concentration may range from 1E18 to 1E19 $cm^{-3}$; 1E19 to 1E21 $cm^{-3}$; or 1E18 to 1E21 $cm^{-3}$ and be provided at the first energy level of 20 to 50 keV; 50 to 100 keV; or 20 to 100 keV. The P-type dopant is subsequently implanted into the upper precursor region 36' at a second concentration and at a second energy level that is higher than the first energy level to form second implants 54 below the first implants 52, as illustrated in FIG. 4C. The second concentration may range from 1E17 to 1E18 $cm^{-3}$; 1E18 to 1E19 $cm^{-3}$; 1E17 to 1E19 $cm^{-3}$ and be provided at the second energy level of 50 to 100 keV; 100 to 200 keV; or 50 to 200 keV. The second implants 54 may extend further inward toward the center of the channel region 36 than the first implants 52.

Figure 4D:
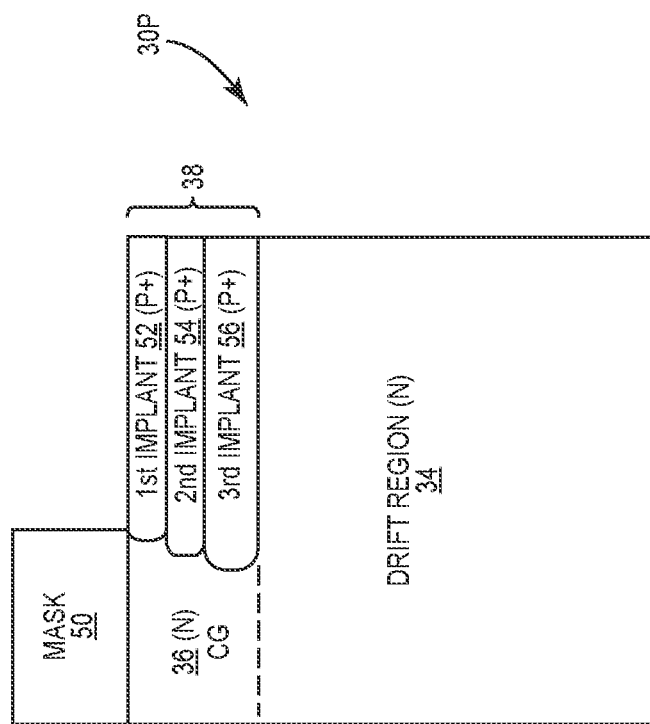
Figure 4C:
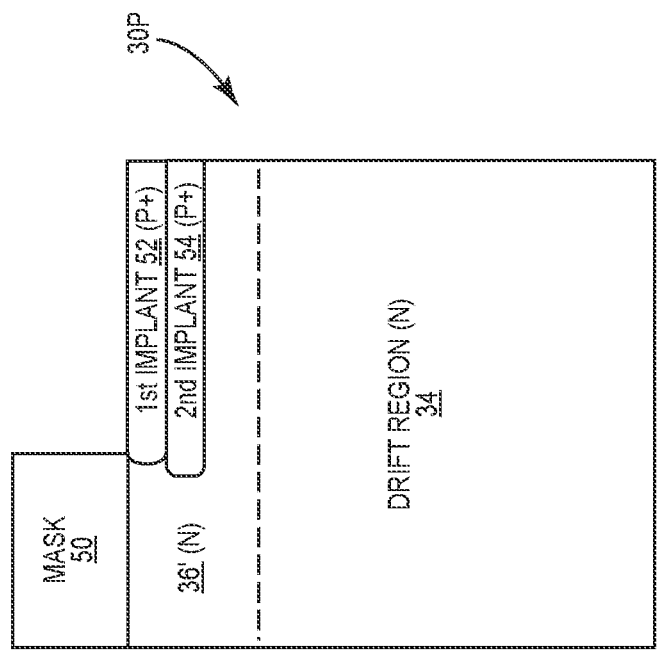

The P-type dopant is implanted into the upper precursor region 36' at a third concentration and at a third energy level that is higher than the second energy level to form third implants 56 below the second implants 54, as illustrated in FIG. 4D. The third concentration may range from 1E17 to 1E18 $cm^{-3}$; 1E18 to 1e19 $cm^{-3}$; or 1E17 to 1E19 $cm^{-3}$ and be provided at the third energy level of 100 to 200 keV; 200 to 300 keV; or 100 to 300 keV. The third implants 56 may extend further inward toward the center of the channel region 36 than the second implants 54. The respective first implants 52, second implants 54, and third implants 56 combine to form the gate regions 38. The example of three P-type gate implants is merely one example; there could be more or fewer depending on the depths and doping profile desired. The remaining portion of the upper precursor region 36' becomes the channel region 36 and the area between the sidewalls SW (FIG. 3) of the gate regions 38 forms all or most of the conducting gap CG.

Figure 4F:
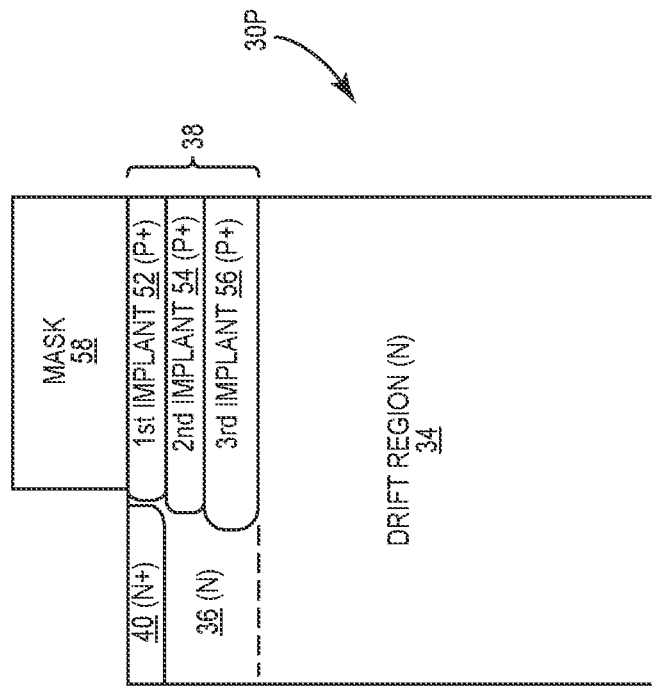
Figure 4E:
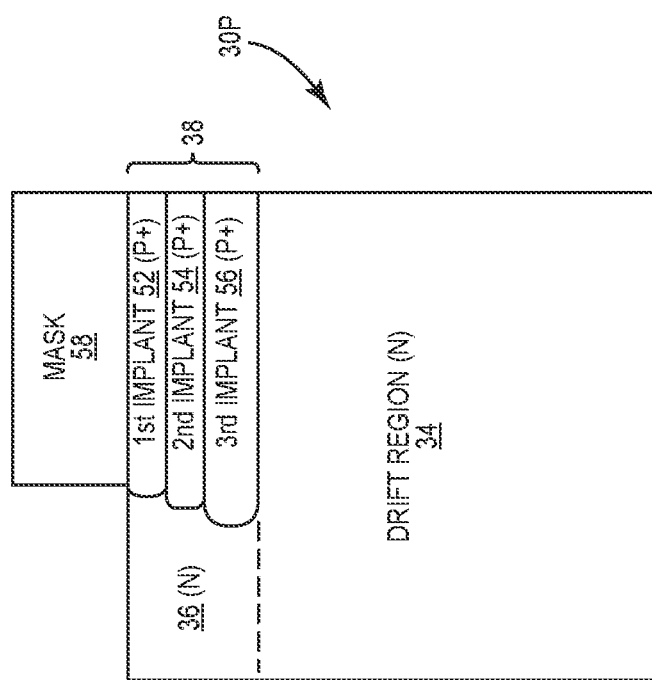

Once the gate regions 38 are formed, the mask 50 is removed and another mask 58 is placed over the gate regions 38, which are formed from the first, second, and third implants 52, 54, 56, as illustrated in FIG. 4E. Next, the N-type dopant is implanted over a central portion of the channel region 36 to form the source ohmic region 40, as illustrated in FIG. 4F. The source ohmic region 40 is generally heavily doped at concentrations ranging from 1E18 to E19 $cm^{-3}$; 1E19 to 1E21 $cm^{-3}$; or 1E18 to 1E21 $cm^{-3}$, in select embodiments. Again, the doping levels provided herein for any of the regions of the device are merely exemplary and actual doping levels may fall outside of the specified ranges depending on the desired characteristics of devices fabricated using any of the techniques disclosed herein.

Figure 4G:
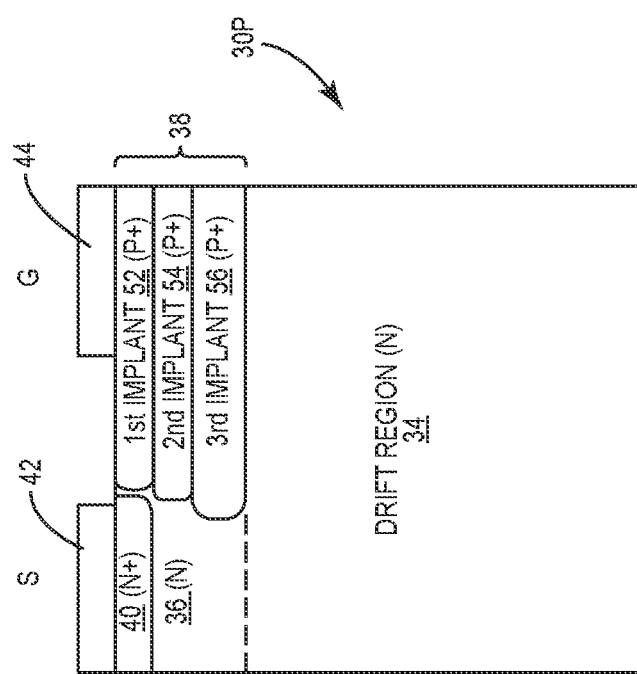

Finally, the second mask 58 is removed, and the source and gate contacts 42, 44 are formed over the source ohmic region 40 and the gate regions 38, as illustrated in FIG. 4G. While not illustrated in the process diagrams of FIGS. 4A-4G, gate ohmic regions 46, which are heavily doped with a P-type dopant, may be provided below the gate contacts 44.

A second process is shown in association with the JEFT 30 of FIG. 5, which illustrates an alternative schematic half-cell of the JFET 30. Notably, the gate region 38 for this embodiment does not tend to straggle inward toward the center of the channel region 36 with depth as provided in the embodiment of FIG. 3. Instead, the sidewalls SW of the gate regions 38 are substantially aligned vertically along most of the gate regions 38. The substantially vertical sidewalls SW of the gate regions 38 afford better control of current through the JFET conducting gap CG, a portion of which resides in the channel region 38 and between the sidewalls SW, than the embodiment of FIG. 3. The result is better control over channel resistance in the on-state and current blocking in the off-state. As such, the implantation process effectively controls the shape and size of the conducting gap CG by controlling the relative alignment, shape, and/or slope of the sidewalls SW of the gate regions 38 or portions thereof.

Figure 6B:
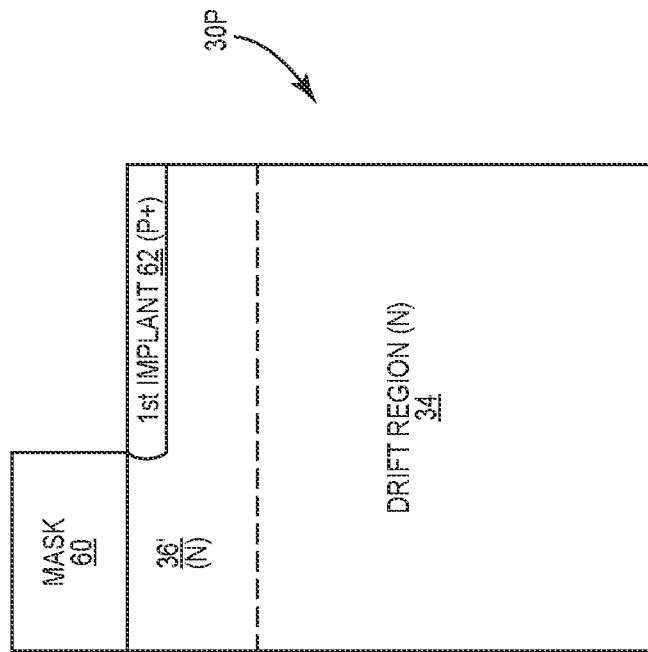
Figure 6A:
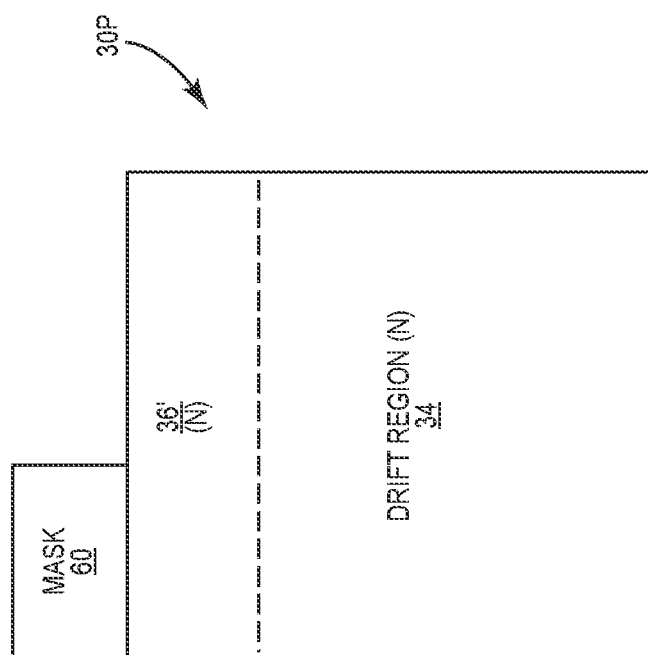

The second process starts in a similar fashion as the prior process by applying a mask 60 over a portion of a top, substantially planar surface of a precursor 30P of the JFET 10, as shown in FIG. 6A. The location of the mask 60 corresponds to an area on the surface of the precursor 30P that resides over the central portion of the precursor region 36'. To form the opposing gate regions 38 in the top of the precursor 30P, a series of implants, which successively increase in energy, are provided. For each of the gate regions 38, each of the successive implants will form at a different depth due to the increased energy levels. As illustrated, there are three successive implants which range from approximately 50 kilo-electronvolts (50 keV) to 2 mega-electronvolts (2 meV), but any number of implants are envisioned over varying energy levels. Each successive implant is deeper than a preceding implant; however, the process may be reversed such that each successive implant is above a preceding implant.

Figure 6D:
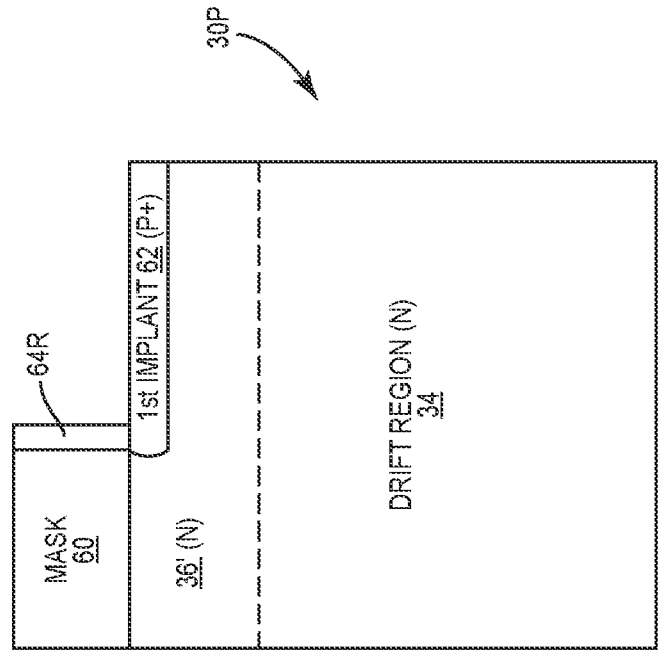
Figure 6C:
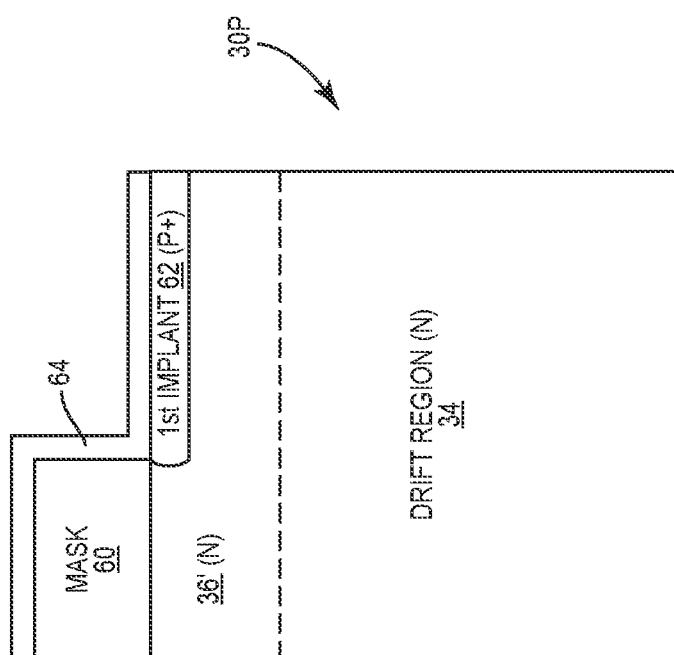

Accordingly, a P-type dopant is implanted at a first concentration and at a first energy level to form first implants 62, as illustrated in FIG. 6B. The first concentration may range from 1E18 to 1E19 $cm^{-3}$; 1E19 to 1E21 $cm^{-3}$; or 1E18 to 1E21 $cm^{-3}$ and be provided at the first energy level of 20 to 50 keV; 50 to 100 keV; or 20 to 100 keV. Next, a first sacrificial layer 64 is formed over the exposed top surface of the precursor 30P as well as the top and side surfaces of the first mask 60, as illustrated in FIG. 6C. The first sacrificial layer 64 may be $SiO_2$, $Si_3N_4$, or the like non-reacting layer and may be formed using typical deposition methods. Once formed, the first sacrificial layer 64 is exposed to an anisotropic etching process, such as reactive ion etching (RIE), sputter etching, or the like. The exposure tends to etch away the horizontal sections of the first sacrificial layer 64 first, such that a first residual portion 64R remains on the sidewalls of the mask 60, as illustrated in FIG. 6D. The first residual portion 64R acts as a lateral spacer for the mask 60.

Next, the P-type dopant is subsequently implanted at a second concentration and at a second energy level to form second implants 66 below the first implants 62, as illustrated in FIG. 6E. The second concentration may range from 1E17 to 1E18 $cm^{-3}$; 1E18 to 1E19 $cm^{-3}$; or 1E17 to 1E19 $cm^{-3}$ and be provided at the second energy level of 50 to 100 keV; 100 to 200 keV; or 50 to 200 keV. Due to lateral extension of the masking provided by the first mask 60 and the first residual portion 64R, the second implants 66 will not straggle inward past the first implants 62, or at least the inward straggle is minimized, relative to the embodiment of FIG. 3.

At this point, a second sacrificial layer 68 is formed over the exposed top surface of the precursor 30P, the top and any exposed side surfaces of the first mask 60, and the top and side surfaces of the first residual portion 64R of the first sacrificial layer 64, as illustrated in FIG. 6F. Once formed, the second sacrificial layer 68 is exposed to an etching solution. As described above, the exposure tends to etch away the horizontal sections of the second sacrificial layer 68 first, such that a second residual portion 68R remains on the sidewalls of the first residual portion 64R, as illustrated in FIG. 6G. The second residual portion 68R acts as another lateral spacer for the mask 60.

Figures 6I, 6J:
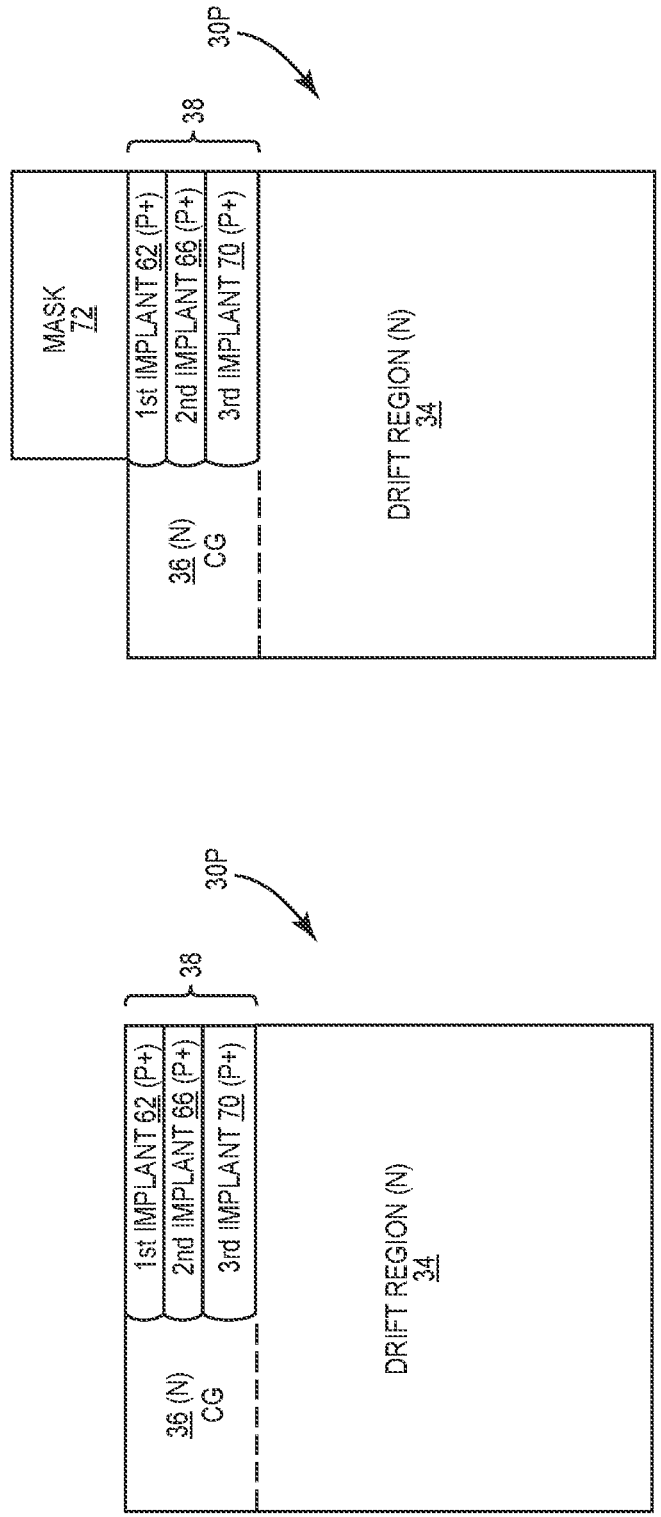

Next, the P-type dopant is subsequently implanted at a third concentration and at a third energy level to form third implants 70 below the second implants 66, as illustrated in FIG. 6H. The third concentration may range from 1E17 to 1E18 $cm^{-3}$; 1E18 to 1E19 $cm^{-3}$; 1E17 to 1E19 $cm^{-3}$ and be provided at the second energy level of 100 to 200 keV; 200 to 300 keV; or 100 to 300 keV. Due to lateral extension of the first mask 60 by the first residual portion 64R and the second residual portion 68R, the third implants 70 will not straggle inward past the first implants 62 and second implants 66, or at least the inward straggle is minimized, relative to the embodiment of FIG. 3. As such, the respective first implants 62, second implants 66, and third implants 70 combine to form the gate regions 38. The mask 60, first residual portion 64R, and the second residual portion 68R are removed, as illustrated in FIG. 6I, and then a second mask 72 is placed over the gate regions 38, as illustrated in FIG. 6J.

Next, the N-type dopant is implanted over a central portion of the channel region 36 to form the source ohmic region 40, as illustrated in FIG. 6K. The source ohmic region 40 is generally heavily doped at concentrations ranging from 1E18 to 1E19 $cm^{-3}$; 1E19 to 1E21 $cm^{-3}$; or 1E18 to 1E21 $cm^{-3}$, in select embodiments. Again, the doping levels provided herein for any of the regions of the device are merely exemplary, and actual doping levels may fall outside of the specified ranges depending on the desired characteristics of devices fabricated using any of the techniques disclosed herein. Finally, the second mask 72 is removed, and the source and gate contacts 42, 44 are formed over the source ohmic region 40 and the gate regions 38, as illustrated in FIG. 6L. While not illustrated in the process diagrams of FIGS. 6A-6L, gate ohmic regions 46, which are heavily doped with a P-type dopant, may be provided below the gate contacts 44, as illustrated in FIG. 5.

A third process is shown in association with the JEFT 30 of FIG. 7, which illustrates a schematic half-cell of the JFET 30. As with the prior embodiment, steps are taken to avoid or at least significantly reduce any straggle by the gate region 38 inward toward the center of the channel region 36 with depth by using a deep channel implant 76.

Figure 8B:
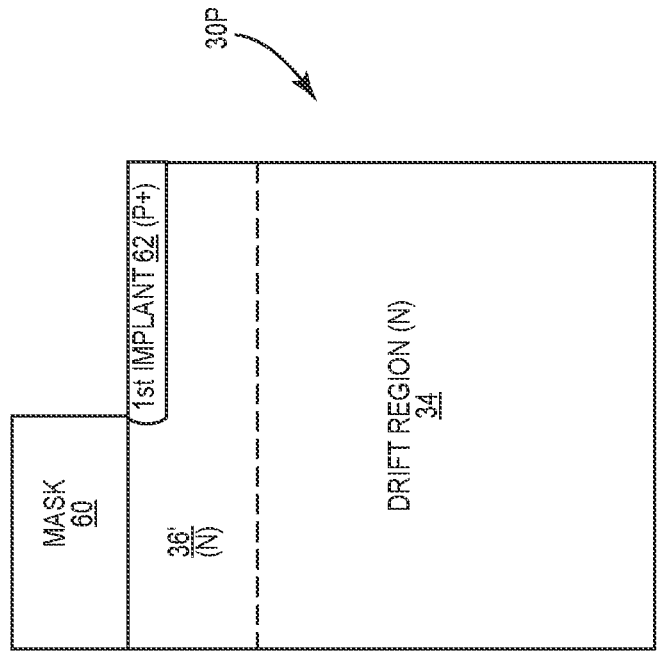
Figure 8A:
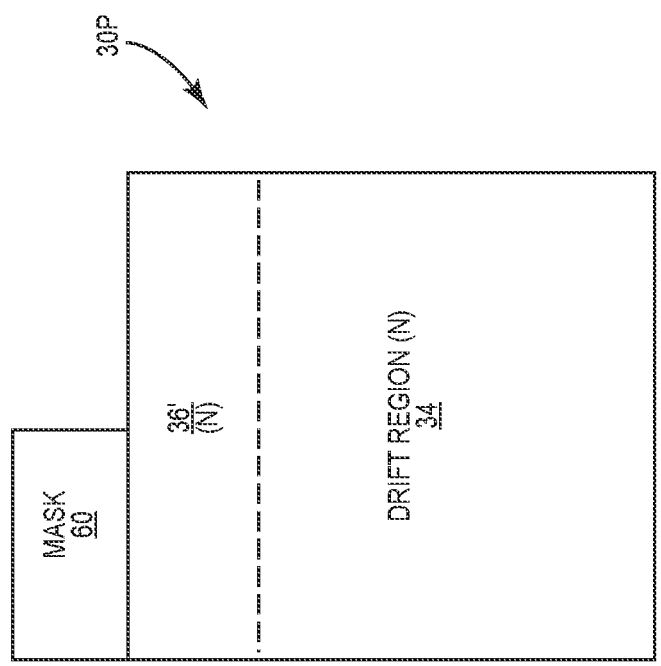

The process starts by applying a mask 60 over a portion of a top, substantially planar surface of a precursor 30P of the JFET 30, as shown in FIG. 8A. The location of the mask 60 corresponds to an area on the surface of the precursor 30P that resides over the central portion of the channel region 36. To form the gate regions 38 in the top of the precursor 30P, a series of implants, which successively increase in energy, are provided. As with the prior embodiments, each successive implant is deeper than a preceding implant. As illustrated, there are three successive implants which range from approximately 50 kilo-electronvolts (50 keV) to 2 mega-electronvolts (2 meV), but any number of implants are envisioned over varying energy levels.

Accordingly, a P-type dopant is implanted at a first concentration and at a first energy level in the upper precursor region 36' to form first implants 62, as illustrated in FIG. 8B. The P-type dopant is subsequently implanted at a second concentration and at a second energy level to form second implants 66 below the first implants 62, as illustrated in FIG. 8C. The second implants 66 may straggle inward to extend further toward the center of the channel region 36 than the first implants 62.

Figure 8D:
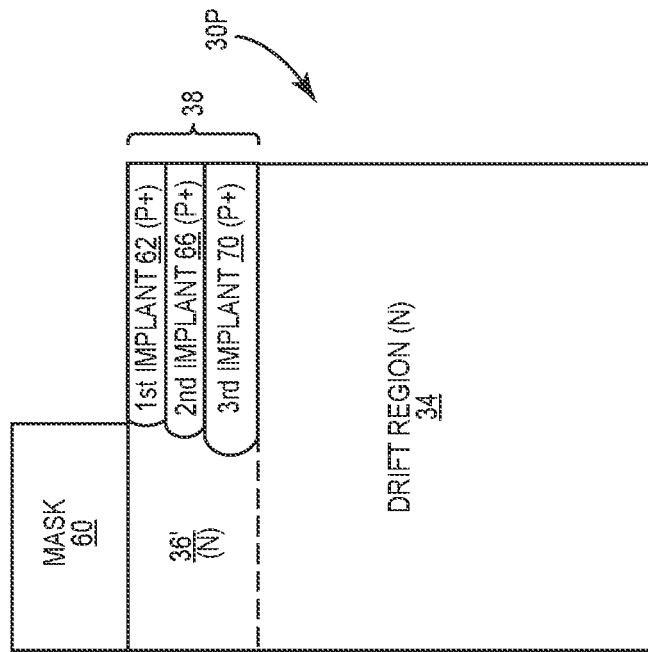
Figure 8C:
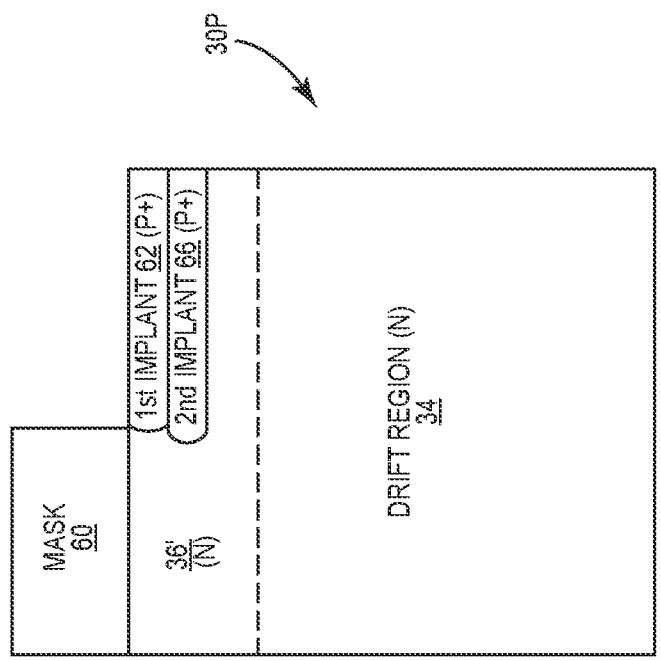
Figure 8F:
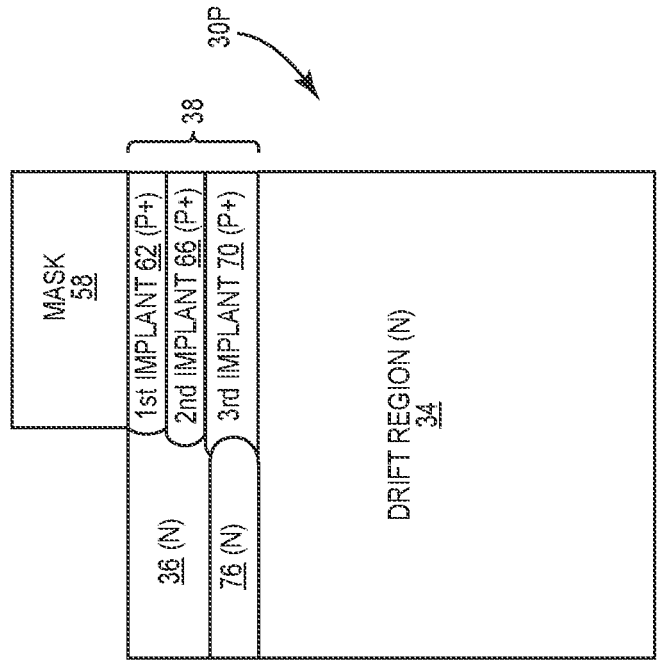
Figure 8E:
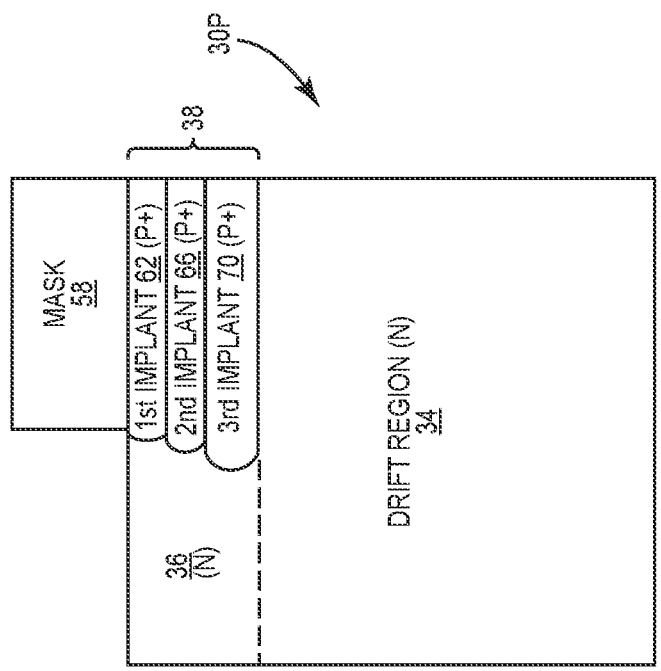

The P-type dopant is implanted at a third concentration and at a third energy level to form third implants 70 below the second implants 66, as illustrated in FIG. 8D. The third implants 70 may straggle inward to extend further toward the center of the channel region 36 than the second implants 66. The respective first implants 62, second implants 66, and third implants 70 combine to form the gate regions 38. Once the gate regions 38 are formed, the mask 60 is removed and another mask 58 is placed over the gate regions 38, which are formed from the first, second, and third implants 62, 66, 70, as illustrated in FIG. 8E.

At this point in the process, each successive one of the implants straggles inward past that of the preceding implant. To counter the straggle of the third implant 70, a deep channel implant 76 is implanted deep within a central portion of the channel region 36, as illustrated in FIG. 8F. In the illustrated embodiment, the deep channel implant 76 is an N-type implant with a height and depth corresponding to the third implant 70. The effect of the deep channel implant 76 is to trim back the interior sidewall of the third implant 70 to reduce or negate the amount that the third implant 70 straggles past the second implant 66 in each gate region 38.

Additional deep channel implants may be employed to counteract the straggle of other implants, such as the second implant 66. Further, the mask 58 may be trimmed, replaced, or enhanced to help control the size, shape, and impact of the deep channel implant 76. Assuming the doping concentrations and ranges of the prior embodiments are employed for the various implants, the doping concentration of deep channel implant 76 may range from 1E16 to 1E17 $cm^{-3}$; 1E17 to 1E18 $cm^{-3}$; or 1E16 to 1E18 $cm^{-3}$ and be provided at an energy level of 100 to 200 keV; 200 to 300 keV; or 100 to 300 keV in certain embodiments. The doping concentration for the deep channel implant 76 may be higher than that of the channel region 36 and sufficient to counteract the P-type doping of the third implant 70.

As in the prior embodiments, an N-type dopant is implanted over a central portion of the channel region 36 to form the source ohmic region 40, as illustrated in FIG. 8G. Finally, the second mask 58 is removed, and the source and gate contacts 42, 44 are formed over the source ohmic region

40 and the gate regions 38, as illustrated in FIG. 8H. While not illustrated in the process diagrams of FIGS. 8A-8H, gate ohmic regions 46, which are heavily doped with a P-type dopant, may be provided below the gate contacts 44.

By addressing the straggle of the gate regions 38, the sidewalls SW of the gate regions 38 are more vertical and less angled. The more vertical sidewalls SW of the gate regions 38 define a more rectangular shape of the conducting gap CG, and as such, afford better control of current through the JFET conducting gap CG. Again, the result is better control over channel resistance in the on-state and current blocking in the off-state.

Another fabrication process is illustrated in association with the embodiment of FIG. 9, wherein a series of successively deeper channel implants is used to form the channel region 36. In this embodiment, the portion of the channel region 36 that resides between the gate regions 38 increases in width with depth. In essence the sidewalls SW of the gate regions 38 are sloped the opposite of that for the embodiment of FIG. 3. For this embodiment as well as the other embodiments described below that use successive implants to form the channel region 36, the implants may be "channeled" implants, which are described in further detail above. Any other implanted regions may be formed using channeled implants as well.

Figure 10B:
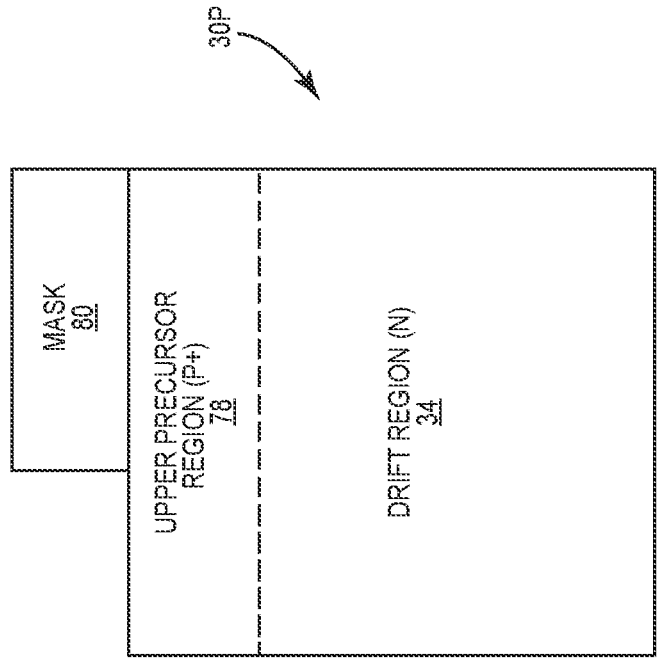
Figure 10A:
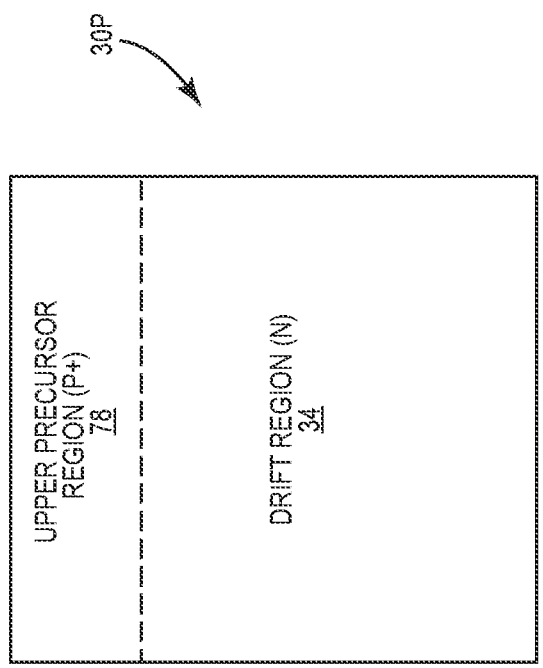

The process begins by providing the precursor 30P, wherein the precursor 30P has an upper precursor region 78, as shown in FIG. 10A. The upper precursor region 78 is an epitaxial layer that is grown to have a P-type doping. The doping concentration in the upper precursor region 78 may range from 1E17 to 1E18 $cm^{-3}$; 5E16 to 5E18 $cm^{-3}$; or 1E17 to 5E18 $cm^{-3}$ and the upper precursor region 78 may be ~1.5 µm to 3 µm, ~1 µm to 3.5 µm, or ~0.5 µm to 4 µm thick, in certain embodiments.

A mask 80 is provided on the upper precursor region 78 over an area where the gate regions 38 will be formed, as illustrated in FIG. 10B. A first channel implant 82 is then provided at the top of the upper precursor region 78 by implanting an N-type material at a first energy level into the P-type upper precursor region 78, as illustrated in FIG. 10C. The concentration of the first channel implant 82 will be higher, such as ~10% to 20% or ~7.5% to 25% higher than the epi P doping level of the upper precursor region 78, ranging from 1.1E17 to 1.1E18 $cm^{-3}$; 1.2E17 to 1.2E18 $cm^{-3}$ and be implanted at energy levels of 20 to 50 keV; 50 to 100 keV; or 20 to 100 keV, in select non-limiting embodiments.

Figure 10D:
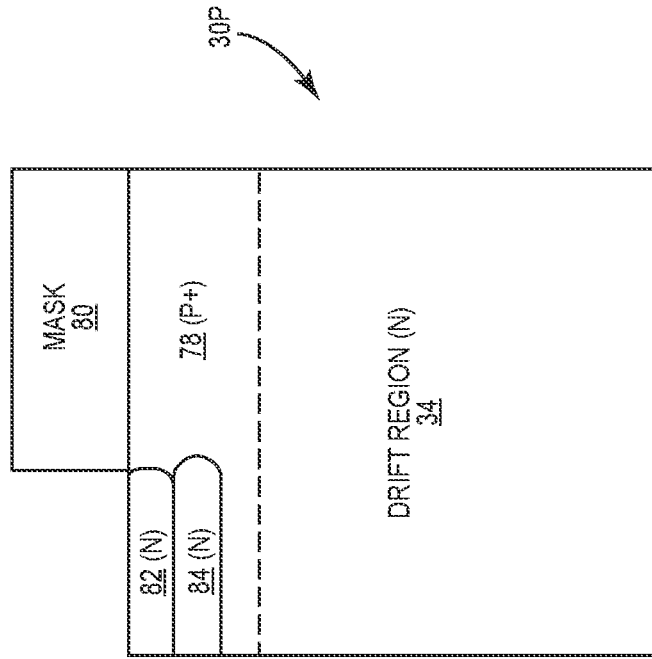
Figure 10C:
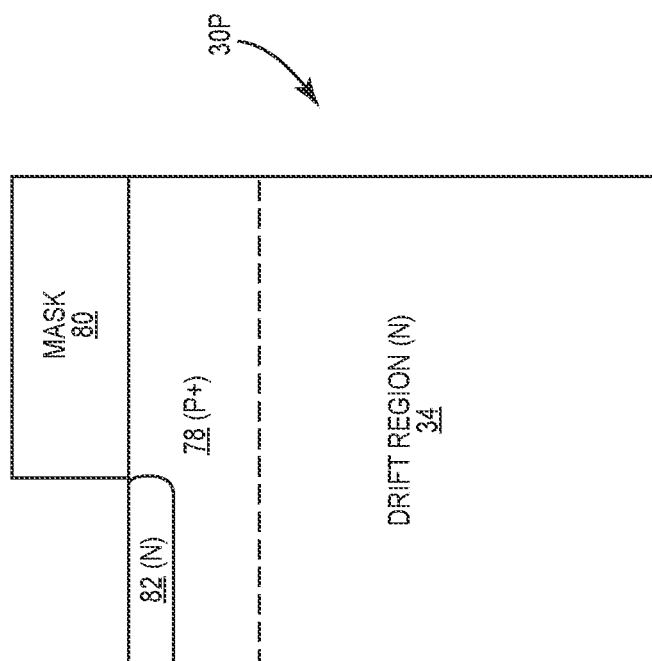

A second channel implant 84 is provided just below the first channel implant 82 in the upper precursor region 78 by implanting an N-type material at a second energy level, as illustrated in FIG. 10D. The concentration of the second channel implant 84 may be ~10% to 20% higher than the epi P doping level, ranging from 1.1E17 to 1.1E18 $cm^{-3}$; 1.2E17 to 1.2E18 $cm^{-3}$; or 1.1E17 to 1.2E18 $cm^{-3}$ and be implanted at energy levels of 50 to 100 keV; 100 keV to 200 keV; or 50 to 200 keV, in select non-limiting embodiments. Assuming the second channel implant 84 is implanted at a higher energy level than that used for the first channel implant 82, the second channel implant 84 will straggle laterally outward past the sides of the first channel implant 82 and expand into the gate regions 38.

Figure 10F:
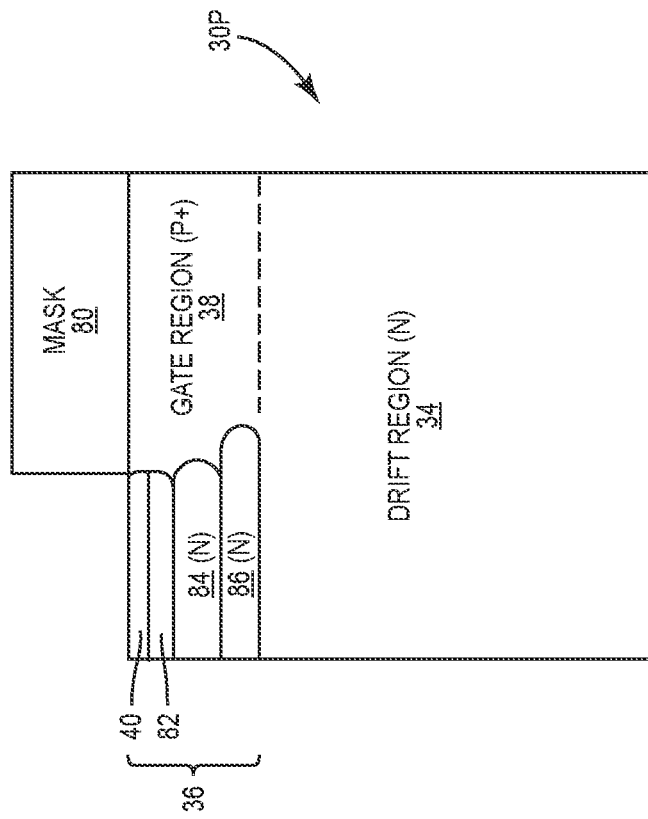
Figure 10E:
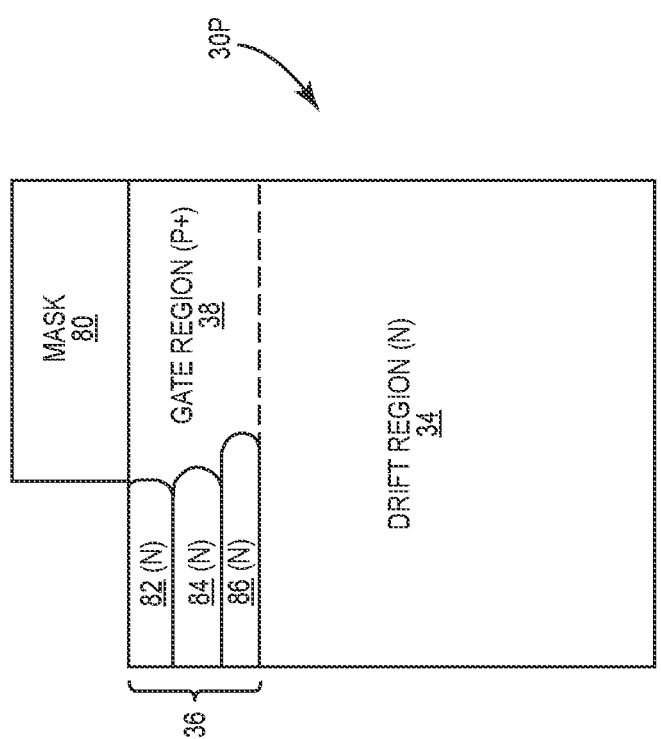

A third channel implant 86 is provided just below the second channel implant 84 in the upper precursor region 78 by implanting an N-type material at a third energy level, as illustrated in FIG. 10E. The concentration of the third channel implant 86 may be ~10% to 20% higher than the epi P doping level, ranging from 1.1E17 to 1.1E18 $cm^{-3}$; 1.2E17 to 1.2E18 $cm^{-3}$; or 1.1E17 to 1.2E18 $cm^{-3}$ and be implanted at energy levels of 100 to 200 keV; 200 to 300 keV; or 100 to 300 keV, in select non-limiting embodiments. Assuming the third channel implant 86 is implanted at a higher energy level than that used for the second channel implant 84, the third channel implant 86 will straggle laterally outward past the sides of the first channel implant 82 and expand into the gate regions 38. While three channel implants (82, 84, 86) are illustrated, the illustrated embodiments are merely exemplary of the successive implantation process. The process may include two, three, four, five, or more implantation levels or layers.

Figure 10G:
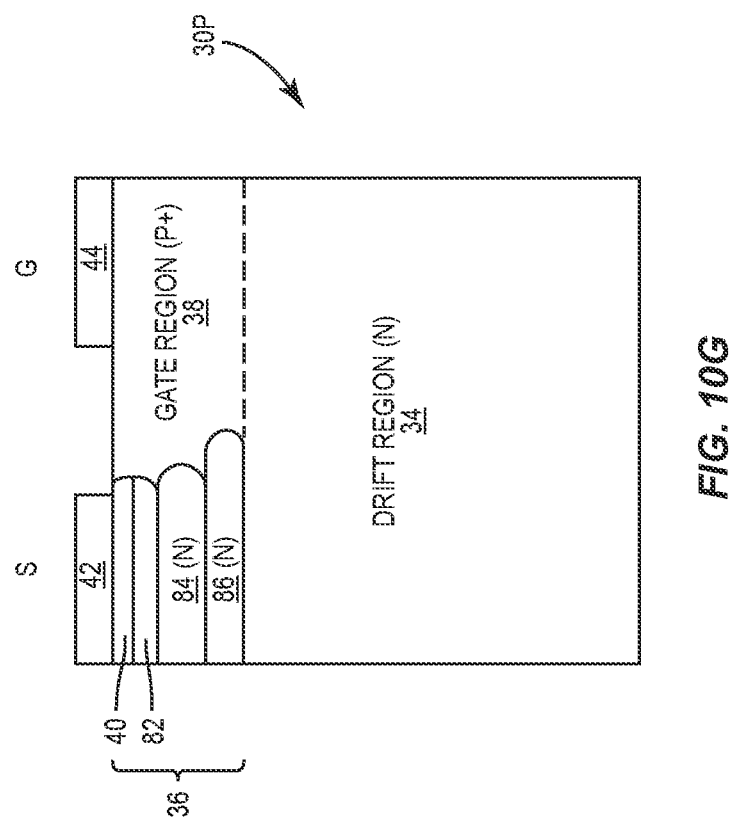

Next, the N-type dopant is implanted in a top portion of or just above the first channel implant 82 to form the source ohmic region 40, as illustrated in FIG. 10F. The source ohmic region 40 is generally heavily doped at concentrations ranging from 1E18 to 1E19 $cm^{-3}$; 1E19 to 1E21 $cm^{-3}$; or 1E18 to 1E21 $cm^{-3}$, in select embodiments. Finally, the second mask 80 is removed, and the source and gate contacts 42, 44 are formed over the source ohmic region 40 and the gate regions 38, as illustrated in FIG. 10G. While not illustrated in the process diagrams of FIGS. 10A-10G, gate ohmic regions 46, which are heavily doped with a P-type dopant, may be provided below the gate contacts 44 in the gate regions 38. Notably, the gate regions 38 may be formed with a single implant as described immediately above, or in a series of implants as illustrated in previous embodiments.

Figure 11B:
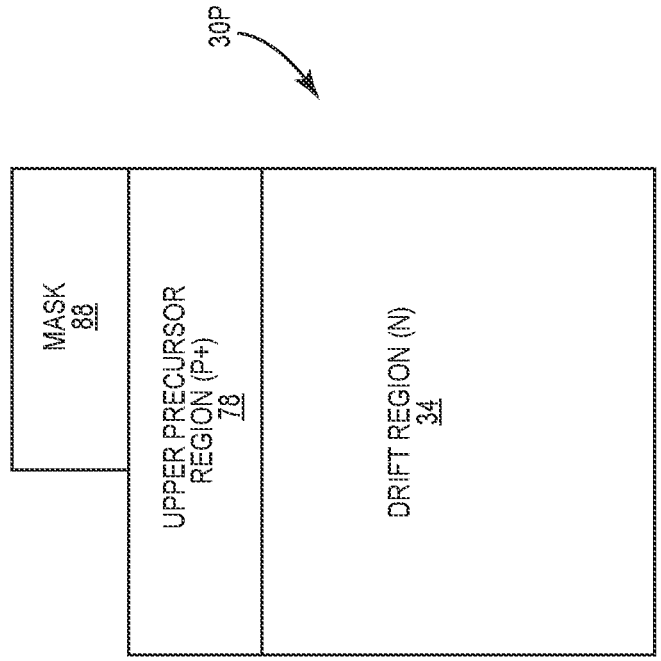
Figure 11A:
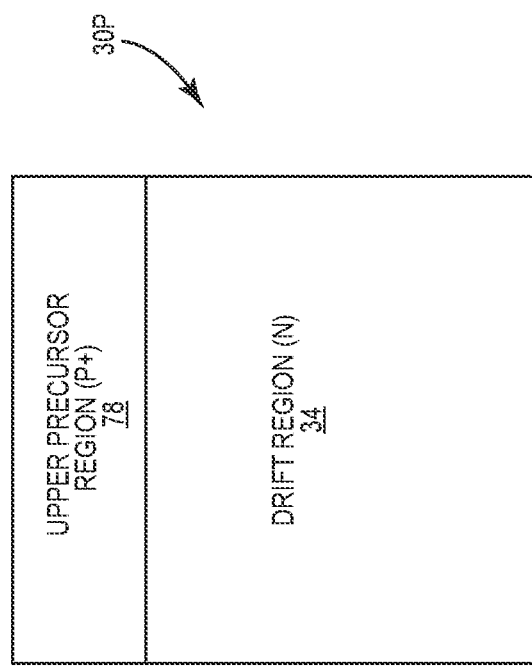

Another process is illustrated in FIGS. 11A-11I, where successive channel implants are provided in a manner to reduce or eliminate straggle of the channel implants. Initially, a JFET precursor 30P is provided, as illustrated in FIG. 11A. A top portion of the JFET precursor 30P is doped with a P-type material to form an upper precursor region 78 at a concentration consistent with what the final gate region 38 will require. As with the previous embodiment, this upper precursor region 78 may be epitaxially grown or implanted. A mask 88 is then formed on the top surface of the precursor 30P, wherein what will become a central area over the channel region 36 is exposed, as illustrated in FIG. 11B.

Figure 11D:
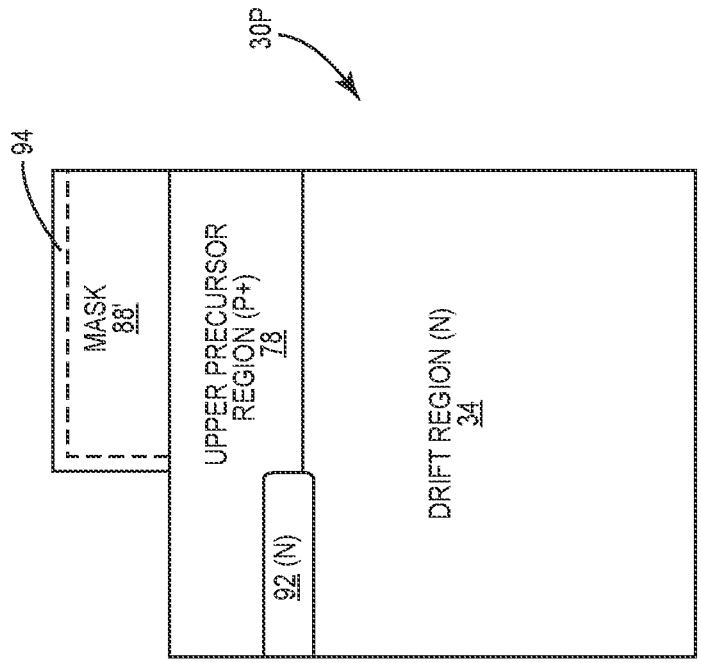
Figure 11C:
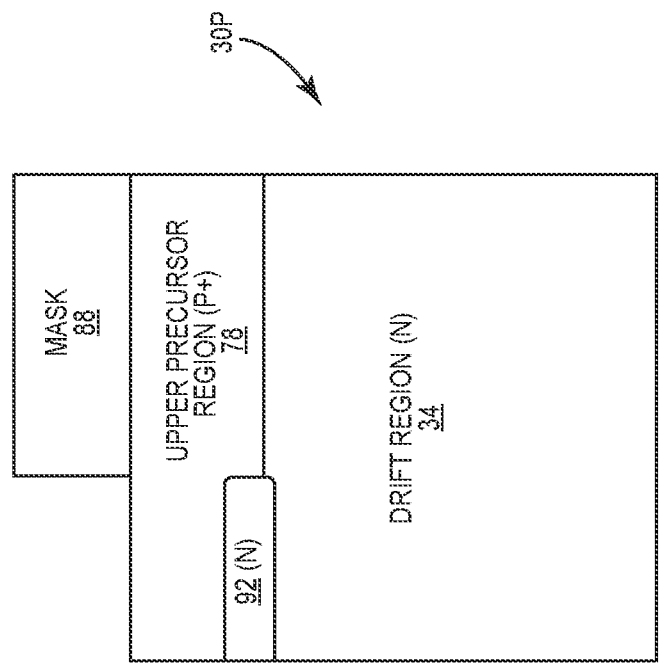

A first channel implant 92 is provided below the central area and at or near the bottom of the upper precursor region 78 by implanting an N-type material at a first energy level, as illustrated in FIG. 11C. The bottom of the first channel implant 92 may extend through the upper precursor region 78 into the drift region 34. The sidewalls of the first channel implant 92 may straggle outside of the sidewall of the mask 88. The concentration of the first channel implant 92 may be ~10% to 20% higher than the epi P doping level, ranging from 1.1E17 to 1.1E18 $cm^{-3}$; 1.2E17 to 1.2E18 $cm^{-3}$; or 1.1E17 to 1.2E18 $cm^{-3}$ and be implanted at energy levels of 100 to 200 keV; 200 to 300 keV; or 100 to 300 keV, in select non-limiting embodiments. Within the upper precursor region 78, there is space between the top of the first channel implant 92 and the top surface of the JFET precursor 30P.

Once the first channel implant 92 is provided, a first portion 94 of the mask 88 is etched away to provide a first etched mask 88', as illustrated in FIG. 11D. Notably, a portion of the sidewall of the mask 88 is removed to reduce the effective coverage of the resulting first etched mask 88'. Next, a second channel implant 96 is provided just above the first channel implant 92 by implanting an N-type material at a second energy level, which is less than the first energy level, as illustrated in FIG. 11E.

Within the upper precursor region 78, there is space between the top of the second channel implant 96 and the top surface of the JFET precursor 30P. Due to the reduced coverage provided by the first etched mask 88' after etching away the first portion 94, the sidewalls of the second channel implant 96 will substantially align with the sidewalls of the first channel implant 92. In other embodiments, the energy used for the implant and the extent of etching of the mask 88 may be altered to control the relative location of the sidewalls for the first and second channel implants 92, 96. The concentration of the second channel implant 96 may be ~10% to 20% higher than the epi P doping level, ranging from 1.1E17 to 1.1E18 $cm^{-3}$; 1.2E17 to 1.2E18 $cm^{-3}$ and be implanted at energy levels of 50 to 100 keV; 100 to 200 keV; or 50 to 200 keV, in select non-limiting embodiments.

Figure 11F:
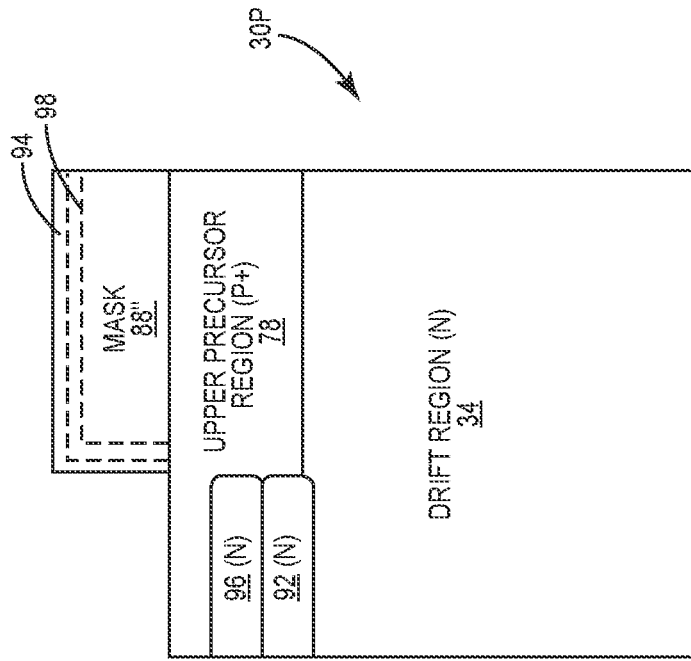
Figure 11E:
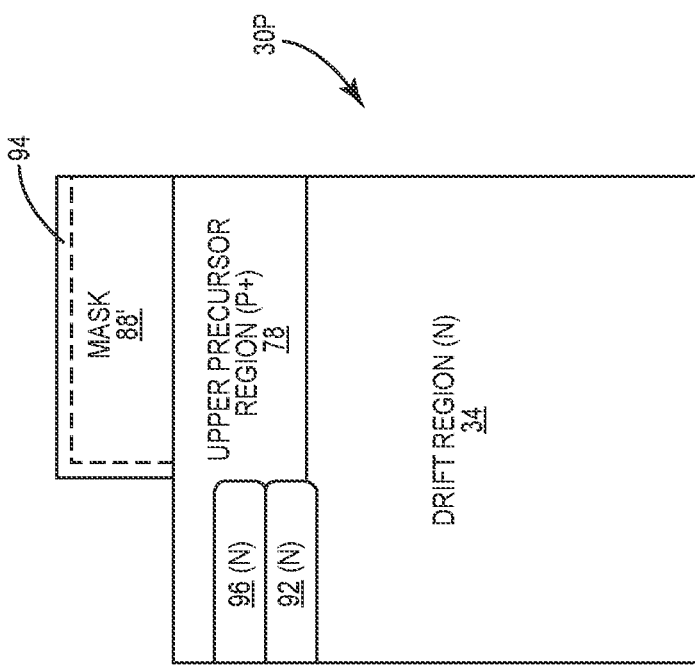

Once the second channel implant 96 is provided, a second portion 98 of the first etched mask 88' is etched away to provide a second etched mask 88", as illustrated in FIG. 11F. Notably, a portion of the sidewall of the second etched mask 88" is removed to further reduce the effective coverage of the mask 88. Next, a third channel implant 100 is provided just above the second channel implant 96 by implanting an N-type material at a third energy level, which is less than the second energy level, as illustrated in FIG. 11G. The concentration of the third channel implant 100 may be ~10% to 20% higher than the epi P doping level, ranging from 1.1E17 to 1.1E18 $cm^{-3}$; 1.2E17 to 1.2E18 $cm^{-3}$ and be implanted at energy levels of 20 to 50 keV; 50 to 100 keV; or 20 to 100 keV, in select non-limiting embodiments.

Within the upper precursor region 78, the third channel implant 100 essentially fills the space between the top of the second channel implant 96 and the top surface of the JFET precursor 30P. Due to the reduced coverage provided by the second etched mask 88" after etching away the second portion 98, the sidewalls of the third channel implant 100 will substantially align with the sidewalls of the first and second channel implants 92, 96. In other embodiments, the energy used for the implant and the extent of etching of the mask 88 may be altered to control the location of the sidewalls for the third channel implant 100 relative to the first and second channel implants 92, 96. The combination of first, second, and third channel implants 92, 96, 100 collectively form all or at least a portion of the channel region 36.

Figure 11H:
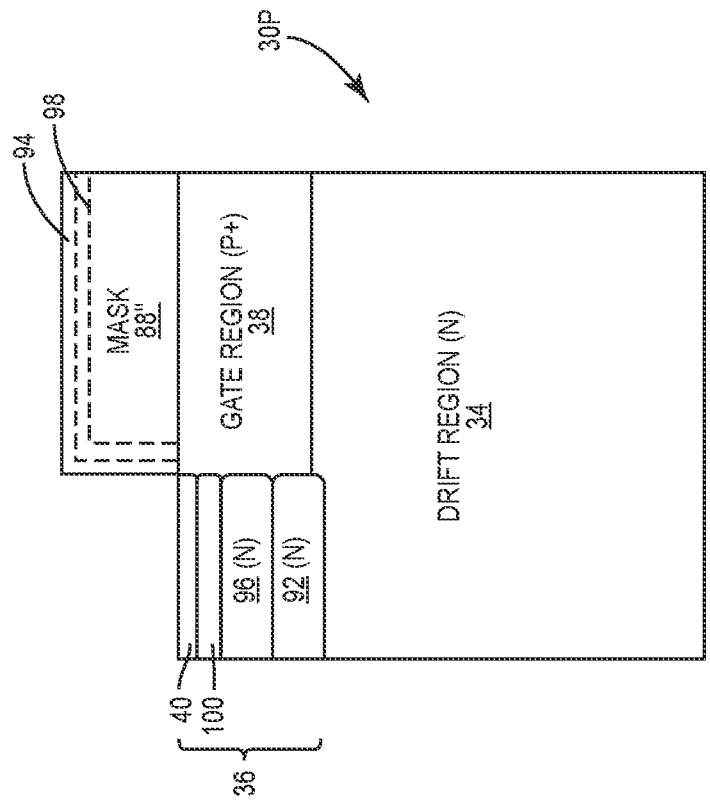
Figure 11G:
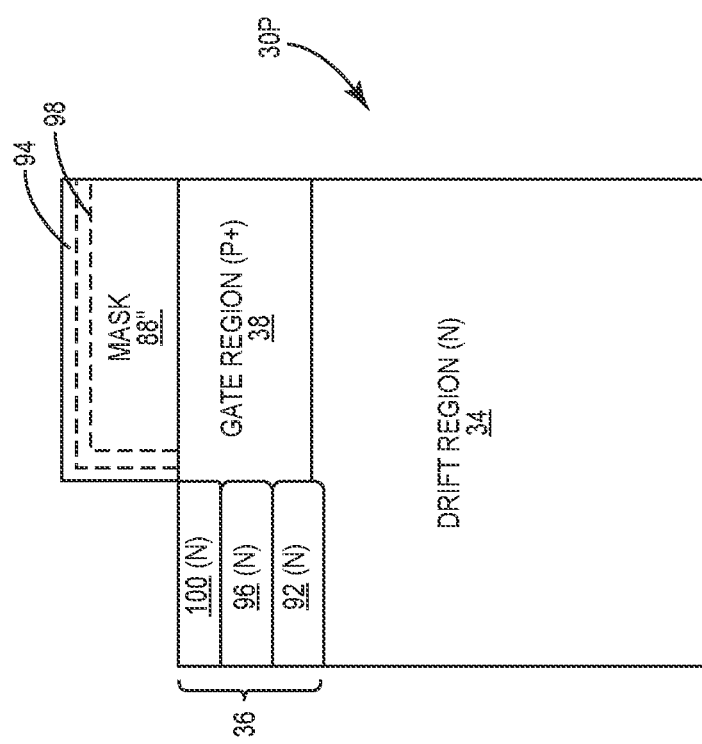
Figure 11I:
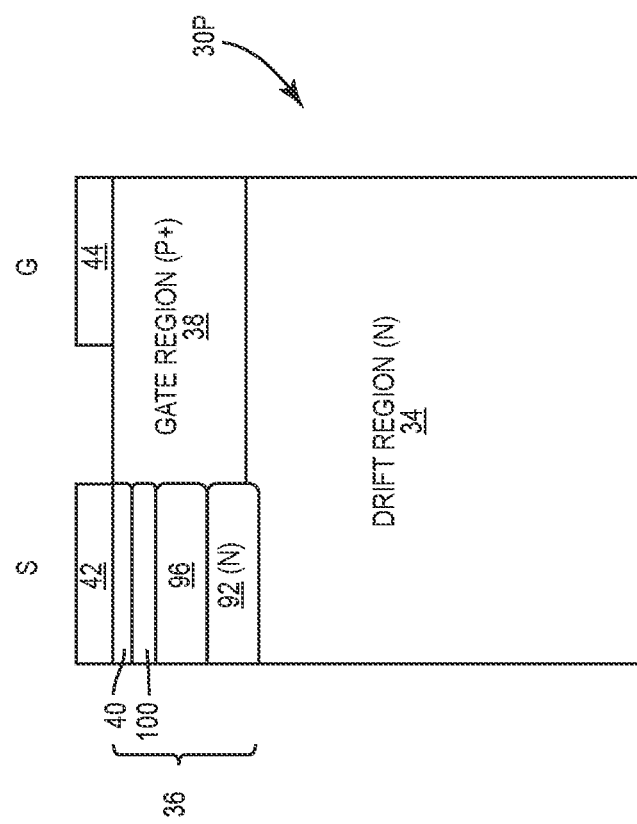

Next, the N-type dopant is implanted in a top portion of the third channel implant 100 to form the source ohmic region 40, as illustrated in FIG. 11H. The source ohmic region 40 is generally heavily doped at concentrations ranging from 1E18 to 1E19 $cm^{-3}$; 1E19 to 1E21 $cm^{-3}$; or 1E18 to 1E21 $cm^{-3}$, in select embodiments. Finally, the second etched mask 88" is removed, and the source and gate contacts 42, 44 are formed over the source ohmic region 40 and the gate regions 38, as illustrated in FIG. 11I. While not illustrated in the process diagrams of FIGS. 11A-11I, gate ohmic regions 46, which are heavily doped with a P-type dopant, may be provided below the gate contacts 44 in the gate regions 38. The remaining portion of the P-doped upper precursor region 78 becomes the gate region 38.

The next process described is a modification of the process described in association with FIGS. 9 and 10A-10G. In that process, first, second, and third channel implants 82, 84, 86 were successively implanted, wherein each successive implant straggled past the previous implant. The result was a widening of the opening provided by the gate regions 38 with depth. To counteract at least some of the straggle of the lower implants, a deep gate region implant may be provided as described in association with FIGS. 12A-12D.

Figures 12A, 12B:
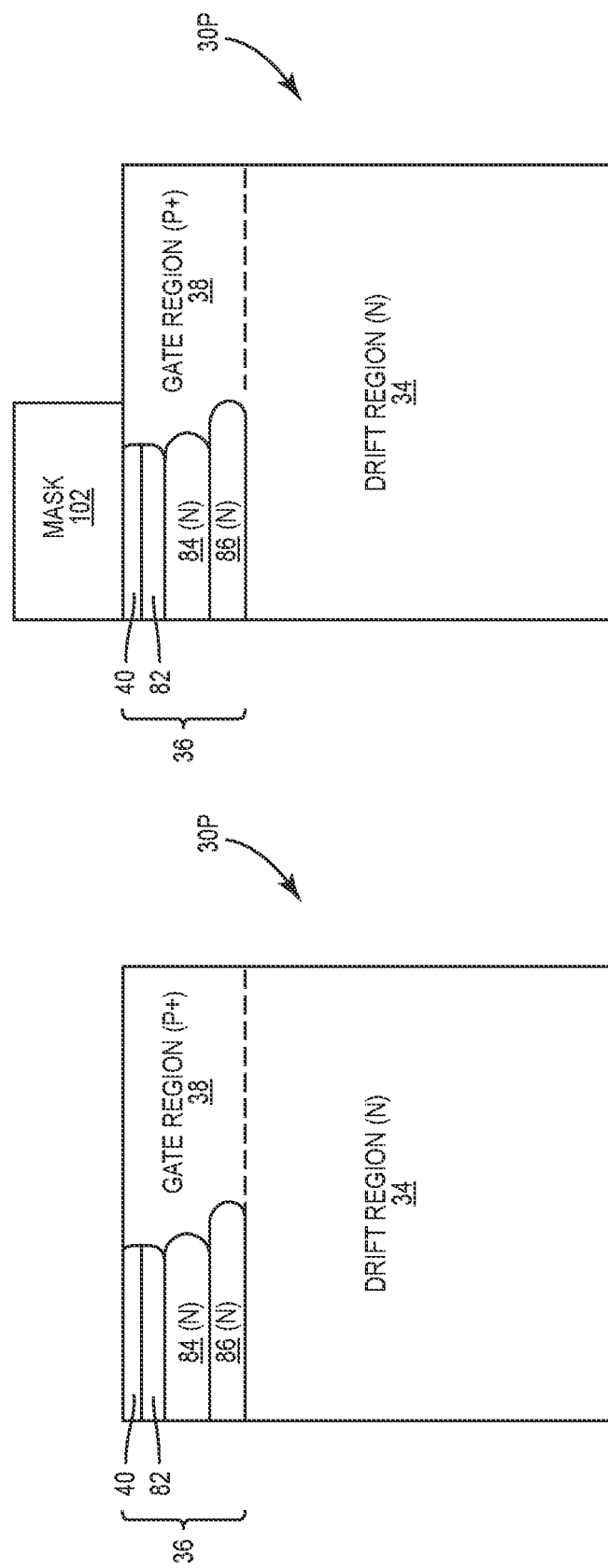
Figures 12C, 12D:
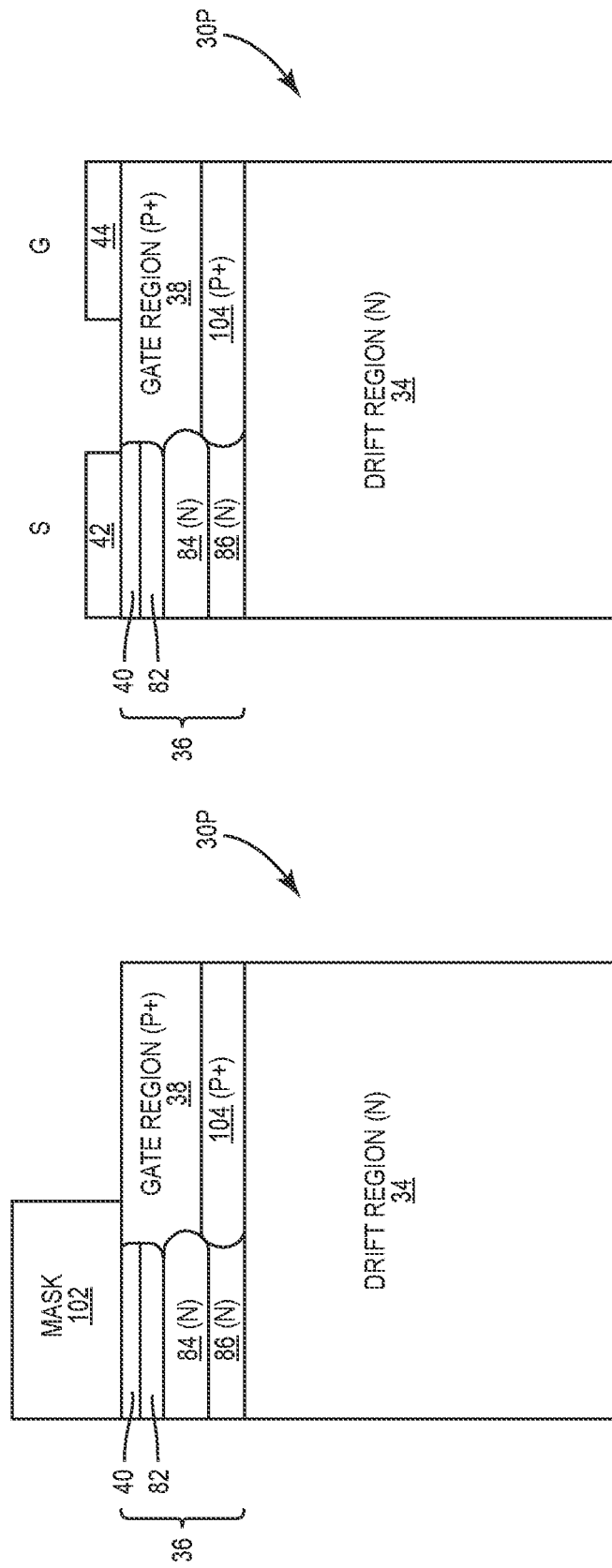

The current process is the same as that illustrated in FIGS. 10A-10F. The process continues with the removal of the mask 80, as illustrated in FIG. 12A, and application of a channel mask 102 over a central portion of the channel region 36, as illustrated in FIG. 12B. Notably, the channel mask 102 extends over an interior portion of the gate region 38 as well as past the some or all of the first, second, and third channel implants 82 84, 86. Next, a deep gate implant 104 is provided using the P-type dopant in the bottom of the gate region 38, as illustrated in FIG. 12C. Notably, the deep gate implant 104 and the channel mask 102 are provided such that the deep gate implant 104 overlaps the outside portions of the third channel implant 86 and/or the second channel implant 84. As a result, the effective sidewalls of the second and/or third channel implants 84, 86 are trimmed back to more align with the sidewall of the first channel implant 82 to counteract straggle of the second and/or third channel implants 84, 86 to a desired amount. The concentration of the deep gate implant 104 may range from 1E17 to 1E18 $cm^{-3}$; 1E18 to 1E19 $cm^{-3}$; or 1E17 to 1E19 $cm^{-3}$ and be implanted at energy levels of 100 to 200 keV; 200 to 300 keV; 100 to 300 keV, in select non-limiting embodiments.

Although only one deep channel implant 104 is illustrated, multiple implants may be provided at varying levels to effectively adjust the location of the sidewalls associated with the gate region 38, the channel regions 36, as well as any supplemental channel or gate implants to redefine the shape and size of the conducing gap CG. Finally, the source and gate contacts 42, 44 are formed over the channel and gate regions 36, 38, as illustrated in FIG. 12D.

Figure 13B:
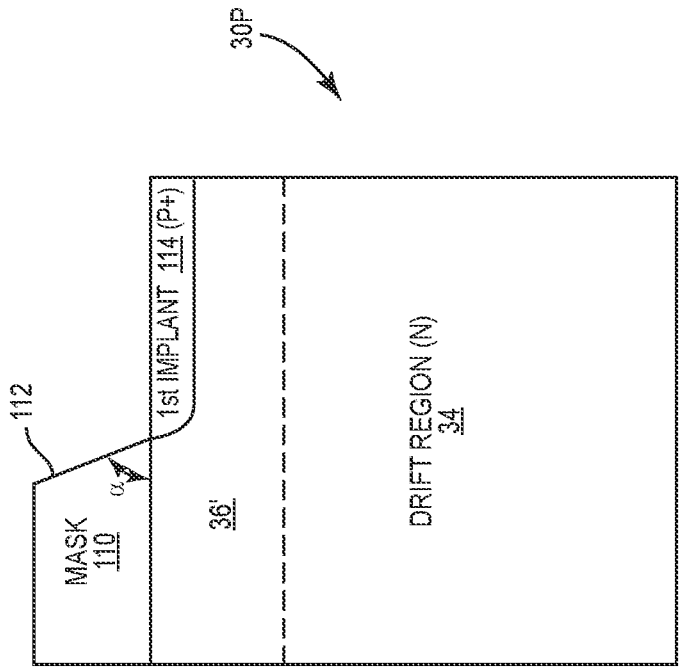
Figure 13A:
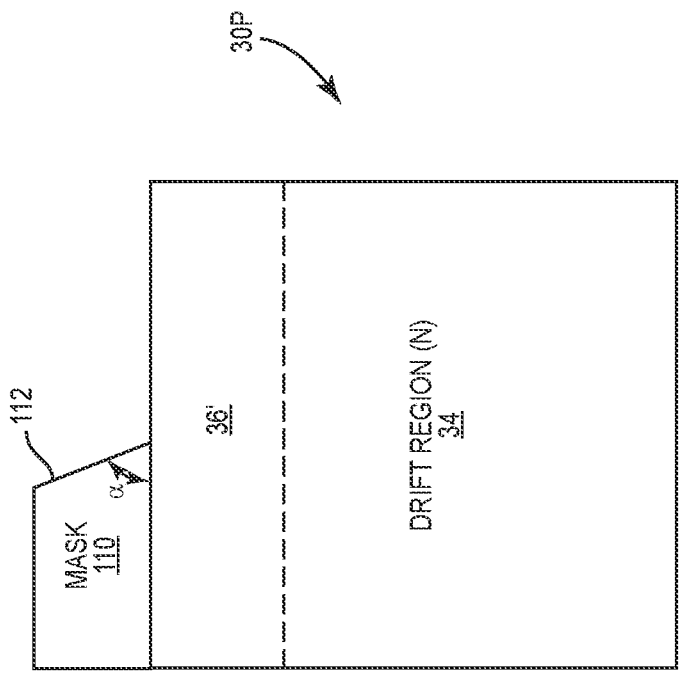

Another process is illustrated in association with FIGS. 13A through 13E. In this process, a mask 110 with an angled side wall 112 is provided over a central portion of what will result in the channel region 36, as illustrated in FIG. 13A. The angled sidewall 112 forms an acute angle alpha ($\alpha$) with the surface of the precursor 30P. In certain embodiments, the angle $\alpha$ is in the range of 70 to 90 degrees; 45 to 70 degrees; or 30 to 45 degrees.

To form the gate regions 38 in the top of the precursor 30P, a series of implants, which successively increase in energy, are provided. As illustrated, there are three successive implants which range from approximately 50 kiloelectronvolts (50 keV) to 2 mega-electronvolts (2 meV), but any number of implants are envisioned over varying energy levels.

To start formation of the gate regions 38, a P-type dopant is implanted at a first concentration and at a first energy level to form first implants 114, as illustrated in FIG. 13B. The first concentration may range from 1E17 to 1E18 $cm^{-3}$; 1E18 to 1E20 $cm^{-3}$; 1E17 to 1E20 $cm^{-3}$ and be provided at the first energy level of 20 to 50 keV; 50 to 100 keV; or 20 to 100 keV. Since the mask 110 has the angled sidewall 112, the sidewall of the first implants 114 will be angled wherein the angle of the sidewall of the first implants 114 will be a function of the angle $\alpha$ of the sidewall 112 of the mask 110.

Figures 13C, 13D:
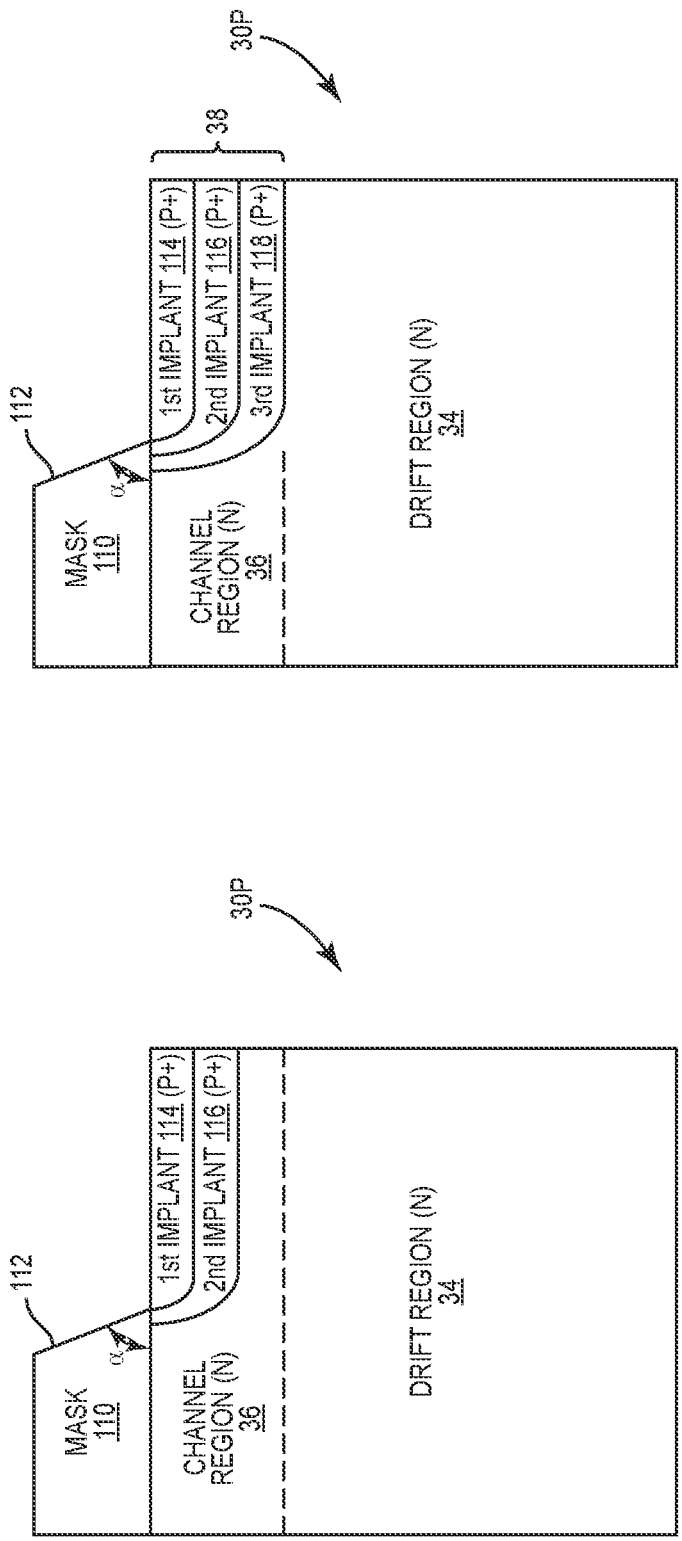

The P-type dopant is subsequently implanted at a second concentration and at a second energy level to form second implants 116 below and along the inside sidewall of the first implants 114, as illustrated in FIG. 13C. The second concentration may range from 1E17 to 1E18 $cm^{-3}$; 1E18 to 1E19 $cm^{-3}$; or 1E17 to 1E19 $cm^{-3}$ and be provided at the second energy level of 50 to 100 keV; 100 to 200 keV; and 50 to 200 keV. As with the first implants 114, the sidewall of the second implants 116 will be angled, wherein the angle of the sidewall of the second implants 116 will be a function of the angle $\alpha$ of the sidewall 112 of the mask 110.

Next, the P-type dopant is subsequently implanted at a third concentration and at a third energy level to form third implants 118 below and along the inner sidewall of the second implants 116, as illustrated in FIG. 13D. The third concentration may range from 1E17 to 1E18 cm$^{-3}$; 1E18 to 1E19 cm$^{-3}$; or 1E17 to 1E19 cm$^{-3}$ and be provided at the third energy level of 100 to 200 keV; 200 to 300 keV; or 100 to 300 keV. As with the first and second implants 114, 116, the sidewall of the third implants 118 will be angled, wherein the angle of the sidewall of the third implants 118 will be a function of the angle α of the sidewall 112 of the mask 110. The respective first implants 114, second implants 116, and third implants 118 combine to form the gate regions 38.

Figure 13F:
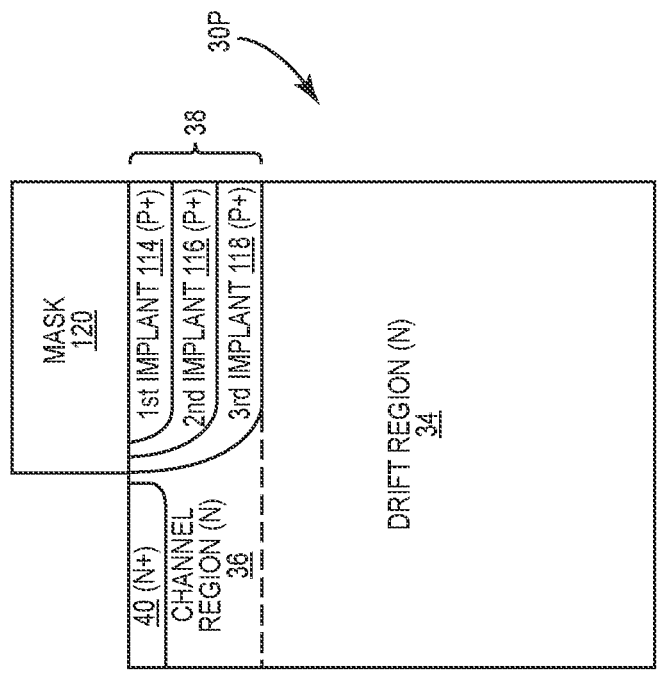
Figure 13E:
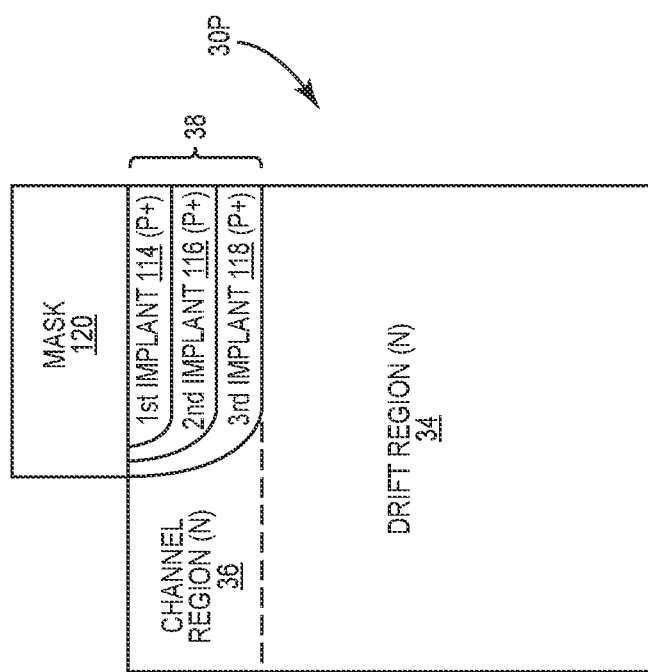

Once the gate regions 38 are formed, the mask 110 is removed and another mask 120 is placed over the gate regions 38, as illustrated in FIG. 13E. Next, the N-type dopant is implanted in successive steps over a central portion of the top surface to form the channel region 36 (if not already doped) and the source ohmic region 40, as illustrated in FIG. 13F. The channel region 36 is generally moderately doped at concentrations ranging from 1E15 to 1E16 cm$^{-3}$; 1E16 to 1E17 cm$^{-3}$; 1E15 to 1E17 cm$^{-3}$ in select embodiments. The source ohmic region 40 is generally heavily doped at concentrations ranging from 1E18 to 1E19 cm$^{-3}$; 1E19 to 1E21 cm$^{-3}$; or 1E18 to 1E21 cm$^{-3}$, in select embodiments. As with any of the various embodiments, the doping levels provided herein for any of the regions of the device are merely exemplary and actual doping levels may fall outside of the specified ranges depending on the desired characteristics of devices fabricated using any of the techniques disclosed herein.

Figure 13G:
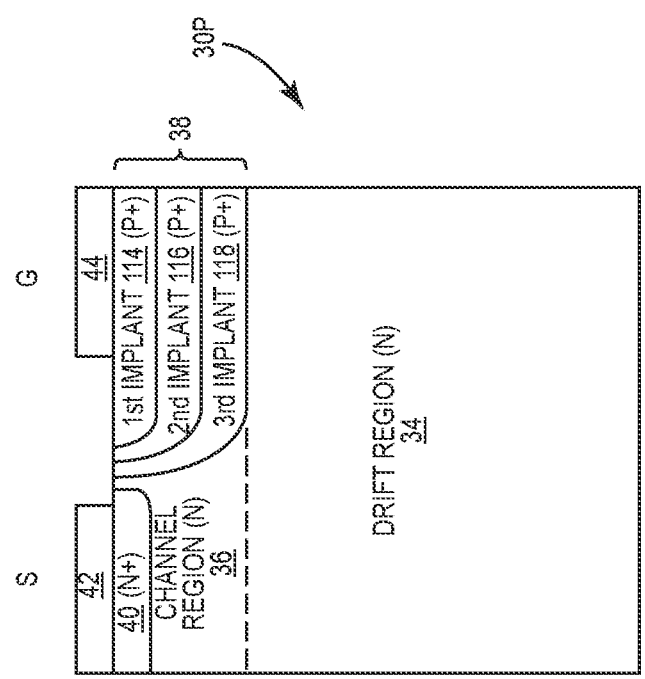

Finally, the mask 120 is removed, and the source and gate contacts 42, 44 are formed over the source ohmic region 40 and the gate regions 38, as illustrated in FIG. 13G. While not illustrated in the process diagrams of FIGS. 13A-13G, gate ohmic regions 46, which are heavily doped with a P-type dopant, may be provided below the gate contacts 44.

Turning now to FIG. 14, an embodiment is illustrated with a heavily doped spreading layer 122, which facilitates the spreading or fanning out of current flowing into the drift layer 34. The spreading layer 122 is typically, but not necessarily, heavily doped with the N-type dopant at a level higher than that of the drift and channel regions 34, 36. The spreading layer 122 may be doped at a level that is one to ten times higher than the drift region 34. For example, the doping concentrations for the spreading layer may be range from 1E16 to 1E17 cm$^{-3}$; 1E17 to 5E17 cm$^{-3}$; or 1E16 cm$^{-3}$ to 5E17 cm$^{-3}$, in select embodiments.

The spreading layer 122 resides along the top of the drift region 34 such that both the channel region 36 and gate regions 38 reside over the spreading layer 122. The spreading layer 122 may extend into the channel region 36 up to 1 micron or more and below the gate region 38 up to 4 microns or more. The spreading layer 122 may be provided in any of the disclosed embodiments and may be formed through implantation or epitaxial growth processes.

The concepts described above may be applied to virtually any type of vertical device, such as diodes, including junction-barrier (JBS) diodes and merged PiN Schottky (MPS) diodes. An exemplary diode 124 is illustrated in FIG. 15. Relative to the JFET of FIG. 2, the source and gate contacts 42, 44 are merged into a single anode contact 126 that extends across the top of the device. Further, the source ohmic region 40 is removed. As with most diodes, the diode 124 cannot be turned on or off like a transistor, but current will flow in one direction, and be blocked in the other. The concepts disclosed herein will allow control of the balance between on-state and blocking properties, for devices that have the same or similar regions and implant doses. As such, each of the above embodiments may be modified to replace the source and gate contacts 42, 44 with a single anode contact 126, wherein the drain contact becomes the cathode contact 128 for the diode 124.

For any of the above embodiments, those skilled in the art will appreciate that additional layers or regions may be provided in the devices to modify the performance characteristics of the devices for the intended application. For example, additional buffer layers and current spreading layers or regions may be provided between the various drift regions and substrates as well as between the drift regions and the channel regions. Any of the concepts above may be combined with one another as desired. For example, the gate regions 38 and the channel regions 36 may be formed using the series of implants as described above for a given device. Any range or set of ranges, material identification, dimension, metric, or the like provided herein are merely exemplary and not intended to limit scope of this disclosure.

The following identifies numerous exemplary embodiments and the elements associated therewith for the concepts taught above. These embodiments are not exhaustive.

Embodiment 1

A method for forming a vertical semiconductor device comprising:
providing a precursor comprising a substrate, a drift region over the substrate, and an upper precursor region, wherein a top surface of the precursor is substantially planar, and the substrate and the drift region are doped with a first dopant of a first polarity;
providing a series of implants with a second dopant in the upper precursor region via the top surface to form each of at least two gate regions, such that each implant of the series of implants is provided at a different depth below the top surface, wherein:
the second dopant has a second polarity opposite that of the first polarity;
at least a portion of a channel region is provided between the at least two gate regions; and
a conducting gap is defined within the channel region and between opposing sidewalls of the at least two gate regions.

Embodiment 2

The method of embodiment 1 further comprising: prior to providing the series of implants, providing a mask on the top surface over an area below which a central portion of the channel region will be formed, wherein areas on the top surface over which the at least two gate regions will be formed are exposed for the series of implants.

Embodiment 3

The method of any of the preceding embodiments wherein each successive one of the series of implants is below and has an inner sidewall that straggles further inward toward the channel region than a preceding one of the series of implants.

Embodiment 4

The method of any of the preceding embodiments further comprising, prior to providing the series of implants, providing a mask on the top surface over an area below which a central portion of the channel region will be formed wherein areas on the top surface over which the at least two gate regions will be formed.

Embodiment 5

The method of any of the preceding embodiments wherein the mask is the only mask used for the series of implants.

Embodiment 6

The method of any of the preceding embodiments further comprising providing an implant of the first dopant in the channel region to form a deep implant, wherein the deep implant is horizontally aligned with and overlaps opposing sidewalls of at least one of the series of implants to effectively move the opposing sidewalls of the at least one of the series of implants laterally outward from the channel region.

Embodiment 7

The method of any of the preceding embodiments 6 wherein the deep implant is horizontally aligned with a second or greater of the series of implants.

Embodiment 8

The method of any of the preceding embodiments wherein the deep implant is not horizontally aligned with a first of the series of implants.

Embodiment 9

The method of any of the preceding embodiments wherein each successive one of the series of implants is below and has an inner sidewall that is substantially aligned with a preceding one of the series of implants.

Embodiment 10

The method of any of the preceding embodiments further comprising:
  prior to a first implant of the series of implants, providing a mask on the top surface over an area below which a central portion of the channel region will be formed wherein areas on the top surface over which the at least two gate regions will be formed are exposed for the series of implants; and
  prior to each successive implant of the series of implants after the first implant, providing a lateral extension of the mask on a side opposite that of the channel region by a desired thickness sufficient to keep the inner sidewall of each successive implant of the series of implants substantially aligned with the inner sidewall the preceding one of the series of implants.

Embodiment 11

The method of any of the preceding embodiments wherein providing each lateral extension of the mask comprises:
  depositing an etchable layer over the mask and exposed portions of the top surface; and etching the etchable layer such that a residual portion of the etchable layer remains on a sidewall of the mask to provide the lateral extension.

Embodiment 12

The method of any of the preceding embodiments further comprising, prior to a first implant of the series of implants, providing a mask on the top surface over an area below which a central portion of the channel region will be formed, wherein sidewalls of the mask are angled such that a bottom surface of the mask and each of the sidewalls of the mask form an acute angle.

Embodiment 13

The method of any of the preceding embodiments wherein the acute angle is in a range of 30 to 90 degrees.

Embodiment 14

The method of any of the preceding embodiments wherein each successive one of the series of implants is below a preceding one of the series of implants and wraps around a sidewall of a preceding one of the series of implants.

Embodiment 15

The method of any of the preceding embodiments wherein each successive one of the series of implants is below a preceding one of the series of implants and wraps around a sidewall of a preceding one of the series of implants up to a top surface of the precursor.

Embodiment 16

The method of any of the preceding embodiments further comprising providing an implant of the first dopant along a bottom of the upper precursor region to form a spreading layer.

Embodiment 17

The method of any of the preceding embodiments further comprising providing an implant of the second dopant in each of the at least two gate regions adjacent the top surface of the precursor to form at least two gate ohmic regions.

Embodiment 18

The method of any of the preceding embodiments wherein the at least two gate ohmic regions are doped at a concentration higher than the at least two gate regions.

Embodiment 19

The method of any of the preceding embodiments 18 further comprising forming a gate contact over each of the at least two gate ohmic regions.

Embodiment 20

The method of any of the preceding embodiments wherein there are at least three implants in the series of implants.

Embodiment 21

The method of any of the preceding embodiments wherein each successive one of the series of implants is below a preceding one of the series of implants.

Embodiment 22

The method of any of the preceding embodiments wherein each successive one of the series of implants is above a preceding one of the series of implants.

Embodiment 23

The method of any of the preceding embodiments wherein the at least two gate regions have a doping concentration in the range of $5E16$ $cm^{-3}$ and $1E20$ $cm^{-3}$ of the second dopant.

Embodiment 24

The method of any of the preceding embodiments wherein the channel region has a doping concentration in the range of $1E14$ $cm^{-3}$ and $1E18$ $cm^{-3}$ of the first dopant.

Embodiment 25

The method of any of the preceding embodiments wherein the at least two gate regions have a doping concentration in the range of $5E16$ $cm^{-3}$ and $1E20$ $cm^{-3}$ of the second dopant, and the channel region has a doping concentration in the range of $1E14$ $cm^{-3}$ and $1E18$ $cm^{-3}$ of the first dopant.

Embodiment 26

The method of any of the preceding embodiments further comprising forming a source contact on a top surface over the channel region.

Embodiment 27

The method of any of the preceding embodiments further comprising providing an implant of the second dopant beneath a top surface of the channel region to form a source ohmic region and forming a source contact on the top surface of the channel region over the source ohmic region.

Embodiment 28

The method of any of the preceding embodiments further comprising forming a gate contact over each of the at least two gate regions.

Embodiment 29

The method of any of the preceding embodiments wherein a drain contact is provided on a bottom surface of the substrate opposite the drift region.

Embodiment 30

The method of any of the preceding embodiments wherein the vertical semiconductor device is a junction field-effect transistor.

Embodiment 31

The method of any of the preceding embodiments wherein the vertical semiconductor device is a diode.

Embodiment 32

A method for forming a vertical semiconductor device comprising:
providing a precursor comprising a substrate, a drift region over the substrate, and an upper precursor region, wherein a top surface of the precursor is substantially planar and the substrate and the drift region are doped with a first dopant of a first polarity;
providing a series of implants with the first dopant in the upper precursor region via the top surface to form a channel region that has at least a portion between two gate regions, such that each implant of the series of implants is provided at a different depth below the top surface, wherein:
each of the two gate regions is doped with a second dopant that has a polarity opposite that of the first dopant; and
a conducting gap is defined within the channel region and between opposing sidewalls of the at least two gate regions.

Embodiment 33

The method of embodiment 32 wherein each successive one of the series of implants is below and has an outer sidewall that straggles further outward toward an adjacent one of the two gate regions than a preceding one of the series of implants.

Embodiment 34

The method of any of the preceding embodiments 32 and 33 further comprising, prior to providing the series of implants, providing a mask on the top surface of the precursor, wherein an area on the top surface over which the channel region will be formed is exposed for the series of implants.

Embodiment 35

The method of any of the preceding embodiments 1-34 wherein the mask is the only mask used for the series of implants.

Embodiment 36

The method of any of the preceding embodiments 32-35 further comprising providing an implant in each gate region to form a deep implant, wherein each deep implant is horizontally aligned with and overlaps a sidewall of the at least one of the series of implants to effectively move the sidewall of the at least one of the series of implants laterally inward toward a central portion of the channel region.

Embodiment 37

The method of any of the preceding embodiments 32-36 wherein the deep implant is horizontally aligned with a second or greater of the series of implants.

Embodiment 38

The method of any of the preceding embodiments 32-37 wherein the deep implant is not horizontally aligned with a first of the series of implants.

Embodiment 39

The method of any of the preceding embodiments 32-38 further comprising:
prior to providing the series of implants, providing a mask on the top surface, wherein an area on the top surface of the precursor over which the channel region will be formed is exposed for the series of implants; and
prior to each successive implant of the series of implants after a first implant, etching away a portion of opposing sidewalls of the mask by an amount sufficient to keep an inner sidewall of each successive implant of the series of implants substantially aligned with an inner sidewall of a preceding one of the series of implants.

Embodiment 40

The method of any of the preceding embodiments 32-39 wherein the each successive one of the series of implants is above the preceding one of the series of implants.

Embodiment 41

The method of any of the preceding embodiments 32-40 wherein a doping concentration for the each successive one of the series of implants is less than that of the preceding one of the series of implants.

Embodiment 42

The method of any of the preceding embodiments 32-41 wherein each successive one of the series of implants is below a preceding one of the series of implants.

Embodiment 43

The method of any of the preceding embodiments 32-42 wherein each successive one of the series of implants is above a preceding one of the series of implants.

Embodiment 44

The method of any of the preceding embodiments 32-43 wherein the two gate regions have a doping concentration in the range of $5E16$ $cm^{-3}$ and $1E20$ $cm^{-3}$ of the second dopant.

Embodiment 45

The method of any of the preceding embodiments 32-44 wherein the channel region has a doping concentration in the range of $1E14$ $cm^{-3}$ and $1E18$ $cm^{-3}$ of the first dopant.

Embodiment 46

The method of any of the preceding embodiments 32-45 wherein the two gate regions have a doping concentration in the range of $5E16$ $cm^{-3}$ and $1E20$ $cm^{-3}$ of the second dopant, and the channel region has a doping concentration in the range of $1E14$ $cm^{-3}$ and $1E18$ $cm^{-3}$ of the first dopant.

Embodiment 47

The method of any of the preceding embodiments 32-46 further comprising forming a source contact on the top surface of the precursor over the channel region.

Embodiment 48

The method of any of the preceding embodiments 32-47 further comprising providing an implant of the second dopant beneath the top surface of the precursor in the channel region to form a source ohmic region and forming a source contact on the top surface of the precursor over the source ohmic region.

Embodiment 49

The method of any of the preceding embodiments 32-48 further comprising forming a gate contact over each of the two gate regions.

Embodiment 50

The method of any of the preceding embodiments 32-49 wherein a drain contact is provided on a bottom surface of the substrate opposite the drift region.

Embodiment 51

The method of any of the preceding embodiments 32-50 wherein the vertical semiconductor device is a junction field-effect transistor.

Embodiment 52

The method of any of the preceding embodiments 32-51 wherein the vertical semiconductor device is a diode.

Embodiment 53

A vertical semiconductor device comprising:
a substrate,
a drift region over the substrate, and
an upper region,
a top surface over the upper region and being substantially planar,
a series of implants of a second dopant in the upper region providing a gate region, such that each implant of the series of implants is located at a different depth below the top surface,
at least two gate regions,
wherein:
the substrate and the drift region are doped with a first dopant of a first polarity;
the second dopant has a second polarity opposite that of the first polarity;
at least a portion of a channel region is provided between the at least two gate regions; and
a conducting gap is defined within the channel region and between opposing sidewalls of the at least two gate regions.

Embodiment 54

The vertical semiconductor device of embodiment 53 wherein each successive one of the series of implants is below and has an inner sidewall that straggles further inward toward the channel region than a preceding one of the series of implants.

Embodiment 55

The vertical semiconductor device of any of the preceding embodiments 53-54 further comprising a deep implant of the first dopant in the channel region, wherein the deep implant is horizontally aligned with opposing sidewalls of at least one of the series of implants.

Embodiment 56

The vertical semiconductor device of any of the preceding embodiments 53-55 wherein each successive one of the series of implants is below and has an inner sidewall that is substantially aligned with a preceding one of the series of implants.

Embodiment 57

The vertical semiconductor device of any of the preceding embodiments 53-56 further comprising an implant of the first dopant along a bottom of the upper precursor region to provide a spreading layer.

Embodiment 58

The vertical semiconductor device of any of the preceding embodiments 53-57 further comprising providing an implant of the second dopant in each of the at least two gate regions adjacent the top surface of the upper region to form at least two gate ohmic regions.

Embodiment 59

A vertical semiconductor device comprising:
a substrate,
a drift region over the substrate,
an upper region,
a top surface over the upper region and being substantially planar, and
a series of implants of a first dopant in the upper region providing a channel region that has at least a portion between two gate regions, such that each implant of the series of implants is located at a different depth below the top surface, wherein:
  the substrate and the drift region are doped with the first dopant of a first polarity;
  each of the two gate regions is doped with a second dopant that has a second polarity opposite that of the first dopant; and
  a conducting gap is defined within the channel region and between opposing sidewalls of the at least two gate regions.

Embodiment 60

The vertical semiconductor device of embodiment 59 wherein each successive one of the series of implants is below and has an outer sidewall that straggles further outward toward an adjacent one of the two gate regions than a preceding one of the series of implants.

Embodiment 61

The vertical semiconductor device of any of the preceding embodiments 59 and 60 further comprising a deep implant in each gate region, wherein each deep implant is horizontally aligned with a sidewall of the at least one of the series of implants.

Those skilled in the art will recognize additional improvements and modifications to the disclosed embodiments of the present disclosure. All such improvements and modifications are considered within the scope of the concepts disclosed herein and the claims that follow.

What is claimed is:

1. A method for forming a vertical semiconductor device comprising:
   providing a precursor comprising a substrate, a drift region over the substrate, and an upper precursor region, wherein a top surface of the precursor is substantially planar, and the substrate and the drift region are doped with a first dopant of a first polarity;
   providing a series of implants with a second dopant in the upper precursor region via the top surface to form each of at least two gate regions, such that each implant of the series of implants is provided at a different depth below the top surface, wherein:
     the second dopant has a second polarity opposite that of the first polarity;
     at least a portion of a channel region is provided between the at least two gate regions; and
     a conducting gap is defined within the channel region and between opposing sidewalls of the at least two gate regions.

2. The method of claim 1 further comprising: prior to providing the series of implants, providing a mask on the top surface over an area below which a central portion of the channel region will be formed, wherein areas on the top surface over which the at least two gate regions will be formed are exposed for the series of implants.

3. The method of claim 1 wherein each successive one of the series of implants is below and has an inner sidewall that straggles further inward toward the channel region than a preceding one of the series of implants.

4. The method of claim 3 further comprising, prior to providing the series of implants, providing a mask on the top surface over an area below which a central portion of the channel region will be formed wherein areas on the top surface over which the at least two gate regions will be formed are exposed for the series of implants.

5. The method of claim 4 wherein the mask is the only mask used for the series of implants.

6. The method of claim 3 further comprising providing an implant of the first dopant in the channel region to form a deep implant, wherein the deep implant is horizontally aligned with and overlaps opposing sidewalls of at least one of the series of implants to effectively move the opposing sidewalls of the at least one of the series of implants laterally outward from the channel region.

7. The method of claim 6 wherein the deep implant is horizontally aligned with a second or greater of the series of implants.

8. The method of claim 7 wherein the deep implant is not horizontally aligned with a first of the series of implants.

9. The method of claim 6 wherein the deep implant is not horizontally aligned with a first of the series of implants.

10. The method of claim 1 wherein each successive one of the series of implants is below and has an inner sidewall that is substantially aligned with a preceding one of the series of implants.

11. The method of claim 10 further comprising:
    prior to a first implant of the series of implants, providing a mask on the top surface over an area below which a central portion of the channel region will be formed wherein areas on the top surface over which the at least two gate regions will be formed are exposed for the series of implants; and prior to each successive implant of the series of implants after the first implant, providing a lateral extension of the mask on a side opposite that of the channel region by a desired thickness sufficient to keep the inner sidewall of each successive implant of the series of implants substantially aligned with the inner sidewall the preceding one of the series of implants.

12. The method of claim 11 wherein providing each lateral extension of the mask comprises:

depositing an etchable layer over the mask and exposed portions of the top surface; and etching the etchable layer such that a residual portion of the etchable layer remains on a sidewall of the mask to provide the lateral extension.

13. The method of claim 1 further comprising, prior to a first implant of the series of implants, providing a mask on the top surface over an area below which a central portion of the channel region will be formed, wherein sidewalls of the mask are angled such that a bottom surface of the mask and each of the sidewalls of the mask form an acute angle.

14. The method of claim 13 wherein the acute angle is in a range of 30 to 90 degrees.

15. The method of claim 13 wherein each successive one of the series of implants is below a preceding one of the series of implants and wraps around a sidewall of a preceding one of the series of implants.

16. The method of claim 13 wherein each successive one of the series of implants is below a preceding one of the series of implants and wraps around a sidewall of a preceding one of the series of implants up to a top surface of the precursor.

17. The method of claim 1 further comprising providing an implant of the first dopant along a bottom of the upper precursor region to form a spreading layer.

18. The method of claim 1 further comprising providing an implant of the second dopant in each of the at least two gate regions adjacent the top surface of the precursor to form at least two gate ohmic regions.

19. The method of claim 18 further comprising forming a gate contact over each of the at least two gate ohmic regions.

20. The method of claim 1 wherein there are at least three implants in the series of implants.

21. The method of claim 1 wherein each successive one of the series of implants is below a preceding one of the series of implants.

22. The method of claim 1 wherein each successive one of the series of implants is above a preceding one of the series of implants.

23. The method of claim 1 further comprising providing an implant of the second dopant beneath a top surface of the channel region to form a source ohmic region and forming a source contact on the top surface of the channel region over the source ohmic region.

24. The method of claim 1 wherein the vertical semiconductor device is a junction field-effect transistor.

25. The method of claim 1 wherein the vertical semiconductor device is a diode.

26. The method of claim 6 further comprising: prior to providing the series of implants, providing a mask on the top surface over an area below which a central portion of the channel region will be formed, wherein areas on the top surface over which the at least two gate regions will be formed are exposed for the series of implants.

27. The method of claim 26 wherein the mask is the only mask used for the series of implants.

28. The method of claim 1 further comprising providing a series of channel implants of dopants having the first polarity within the channel region, such that each channel implant of the series of channel implants is provided at a different depth below the top surface.

29. The method of claim 28 wherein each successive one of the series of channel implants is below and has an inner sidewall that straggles further outward toward the gate region than a preceding one of the series of channel implants.

30. The method of claim 29 further comprising providing an implant of a dopant of the second polarity in the gate region to form a deep gate implant, wherein the deep gate implant is horizontally aligned with and overlaps opposing sidewalls of at least one of the series of channel implants to effectively move the opposing sidewalls of the at least one of the series of channel implants laterally outward from the gate region.

31. The method of claim 30 wherein the deep gate implant is horizontally aligned with a second or greater of the series of channel implants.

* * * * *